United States Patent [19]
Tanaka et al.

[11] Patent Number: 5,497,390
[45] Date of Patent: Mar. 5, 1996

[54] POLARIZATION MODE SWITCHING SEMICONDUCTOR LASER APPARATUS

[75] Inventors: Hidenao Tanaka, Tokyo; Akinori Watabe; Junichi Shimada, both of Saitama; Yoshitada Katagiri; Yoshio Suzuki, both of Tokyo, all of Japan

[73] Assignee: Nippon Telegraph and Telephone Corporation, Japan

[21] Appl. No.: 9,930

[22] Filed: Jan. 27, 1993

[30] Foreign Application Priority Data

Jan. 31, 1992 [JP] Japan .................................. 4-042313
Sep. 7, 1992 [JP] Japan .................................. 4-264237

[51] Int. Cl.$^6$ .................................................. H01S 3/19
[52] U.S. Cl. ........................... 372/50; 372/27; 372/45; 372/46
[58] Field of Search ........................... 372/27, 45, 46, 372/50, 19, 108

[56] References Cited

U.S. PATENT DOCUMENTS

| | | | |
|---|---|---|---|
| 5,012,474 | 4/1991 | White et al. | 372/27 |
| 5,079,774 | 1/1992 | Mendez et al. | 372/27 |
| 5,319,659 | 6/1994 | Hohimer | 372/50 |

OTHER PUBLICATIONS

Y. Mitsuhashi, "Polarization control of an antireflection–coated GaAIAs laser diode by an external optical feedback", J. Appl. Phys. 53(12), Dec. 1982, pp. 9200–9201.

M. J. B. Boermans et. al., "Investication of TE and TM Polarised Laser Emission in GaInP/AIGaInP Lasers By Growth–Controlled Strain", Electronics Letters, 30th Aug. 1990, vol. 26 No. 18, pp. 1438–1439.

Primary Examiner—James W. Davie
Attorney, Agent, or Firm—Blakely, Sokoloff, Taylor & Zafman

[57] ABSTRACT

A semiconductor laser apparatus includes a semiconductor substrate, a first cladding layer, an active layer, a second cladding layer, a second electrode, and a pair of resonator mirrors. The semiconductor substrate has a first electrode on one surface. The first cladding layer is formed on the other surface of the semiconductor substrate. The active layer is placed on the cladding layer. The second cladding layer is placed on the active layer. The second electrode is placed on the second cladding layer. The pair of resonator mirrors are placed in a waveguide direction perpendicular to the surfaces of the semiconductor substrate to oppose each other. The active layer is constituted by a quantum well layer having a tensilely strain. The second electrode is separated into portions not less than two portions.

5 Claims, 24 Drawing Sheets

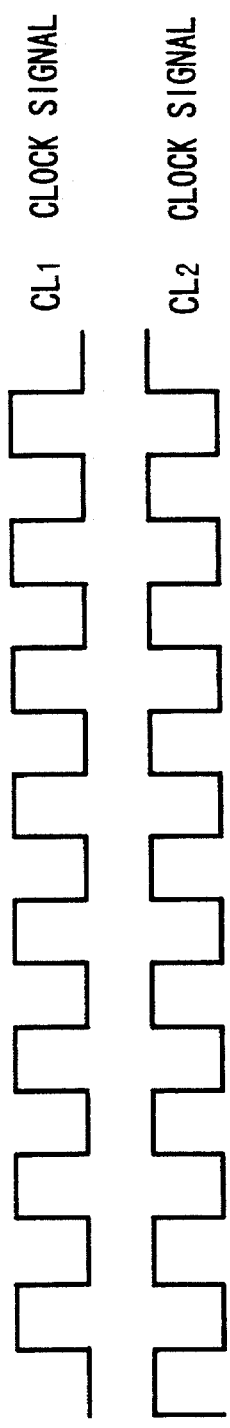
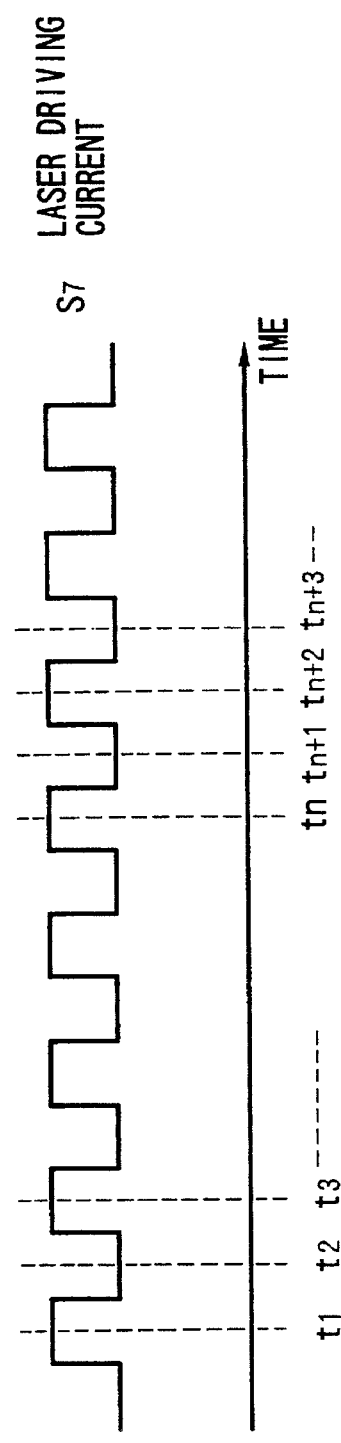
FIG.7A CL1 CLOCK SIGNAL
FIG.7B CL2 CLOCK SIGNAL
FIG.7C S6 LASER DRIVING CURRENT
FIG.7D S7 LASER DRIVING CURRENT

ROTATIONAL DIRECTION OF OPTICAL DISK

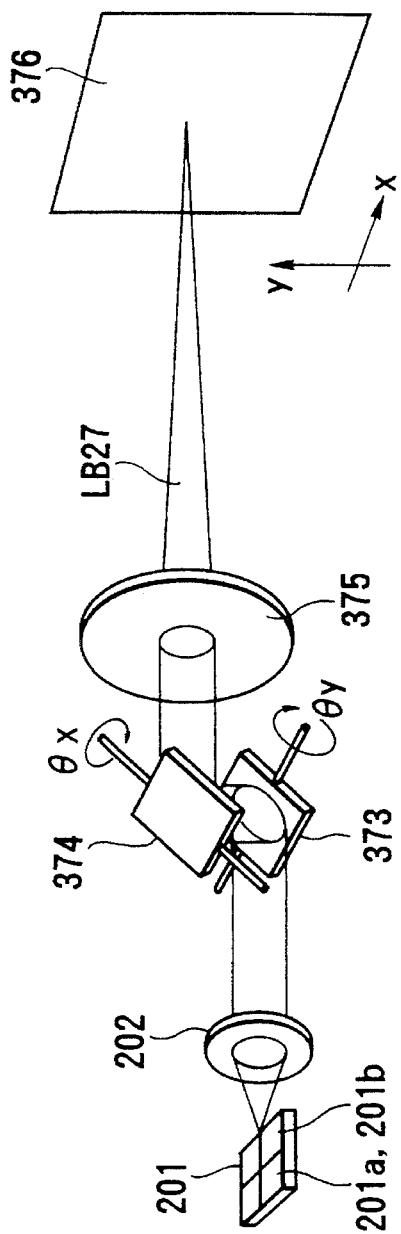
FIG.22
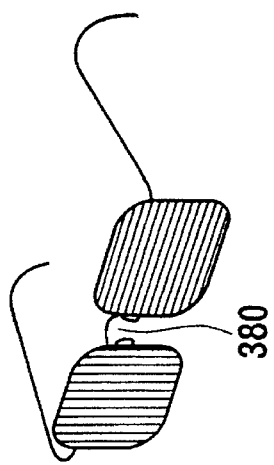
FIG.23
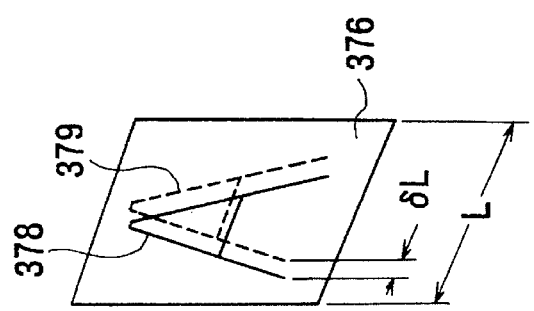

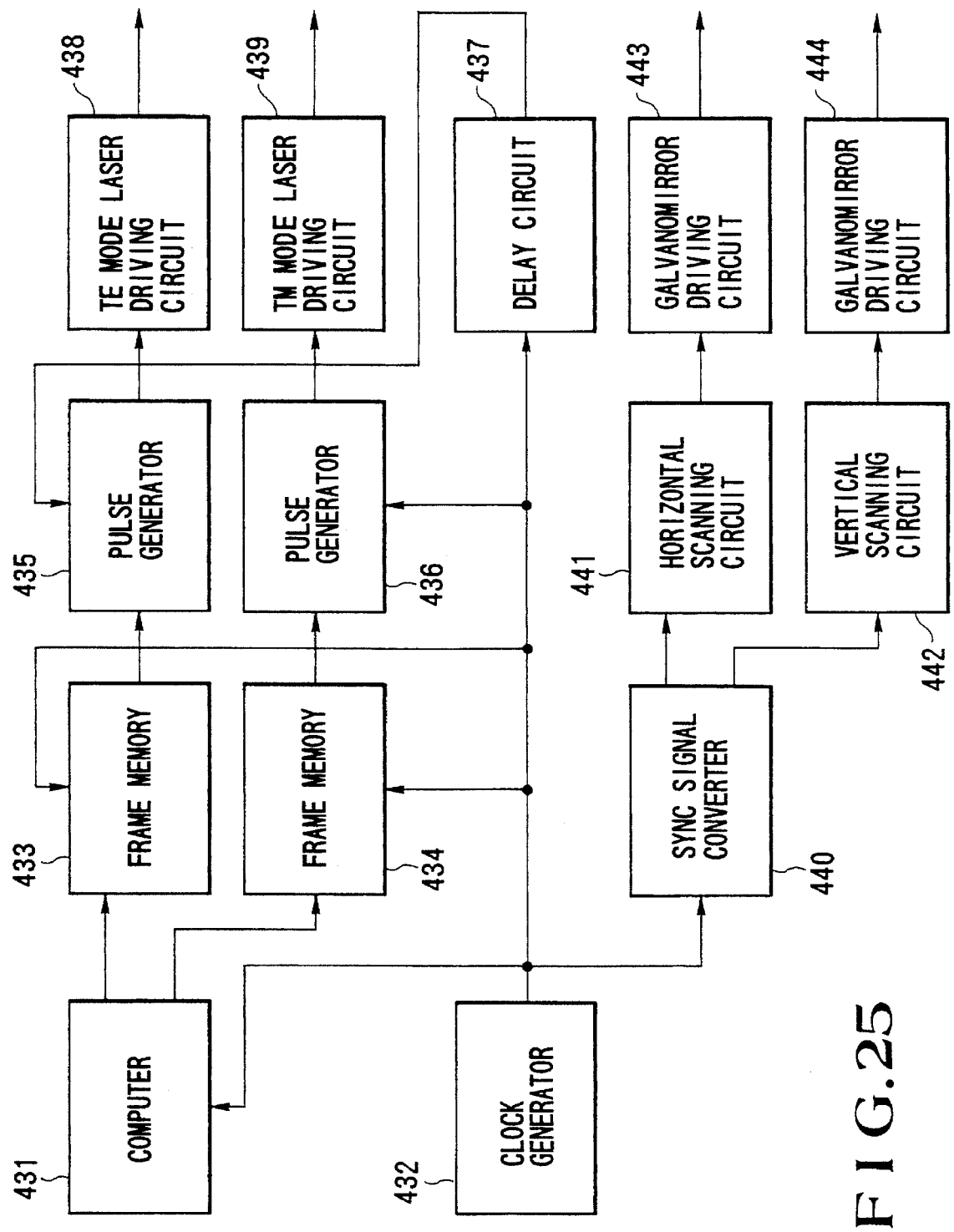
F I G. 25

POLARIZATION MODE SWITCHING SEMICONDUCTOR LASER APPARATUS

BACKGROUND OF THE INVENTION

The present invention relates to a semiconductor laser apparatus.

Since semiconductor laser apparatuses currently used are compact and efficient, a rapid improvement in optical sensing techniques such as an optical recording technique has been achieved. However, in consideration of a sensing technique using polarized light, a light source capable of polarization control is indispensable.

Conventional polarization control in semiconductor laser apparatuses requires an optical system for controlling a reflection loss by using 35 polarizers and the like. For this reason, the size of each element is increased, or an unstable operation results from a positional shift in components.

Consider oscillation mode control in the semiconductor laser apparatuses. Generally, oscillation is produced in only the TE mode (in which electric field components are parallel to the active layer), or in only the TM mode (in which magnetic field components are parallel to the active layer) by applying a tensilely strain to the active layer to increase the gain of the TM mode.

FIGS. 29A and 29B show a conventional semiconductor laser apparatus. Referring to FIGS. 29A and 29B, reference numeral 1 denotes a semiconductor substrate; 2, an active layer consisting of GaAs; 3, an upper cladding layer consisting of AlGaAs; 4, a lower cladding layer consisting of AlGaAs; 5, an insulating layer consisting of $SiO_2$; 6, an upper electrode; 7, a lower electrode; 8 and 9, resonator mirrors; and 10, a optical waveguide stripe.

In this semiconductor laser apparatus, since the active layer is a bulk member, there is no difference between the gain obtained by current injection in the TE mode (in which an electric field is parallel to the active layer) and that in the TM mode (in which an electric field is perpendicular to the active layer). However, the reflectance of each resonator mirror is higher in the TE mode than in the TM mode. For this reason, the semiconductor laser mainly oscillates in the TE mode. In this case, the light intensity of the TM mode is not more than $1/100$ that of the TE mode.

If a quantum well structure having no strain or having a compressively strain is used for the active layer, since electrons in a conduction band are mainly combined with heavy holes in a valence band, the gain obtained by current injection in the TE mode is higher than that in the TM mode. Owing to this high gain in the TE mode as well as the effect of the reflectance of each resonator mirror, the laser apparatus is caused to oscillate in the TE mode.

In contrast to this, if a quantum well layer having a stretching strain is used for the active layer, since electrons in a conductive band are mainly combined with light holes in a valence band, the gain obtained by current injection in the TM mode is higher than that in the TE mode. If this effect is greater than the effect of the reflectance of each resonator mirror, the laser apparatus is caused to oscillate in the TM mode.

As described above, the conventional semiconductor laser apparatuses oscillate either in the TE mode or in the TM mode.

In digital optical communications in which polarized light beams are assigned to information "0" and information "1", polarization interference optical systems for heterodyne detection, optical sensors based on differences in reaction to polarized light, and the like, both the TE and TM modes are required. In such a case, if a conventional semiconductor laser apparatus is used, a wave plate for converting polarized light of the TE mode into that of the TM mode is required. Generally, a wave plate is made of an expensive dielectric crystal having birefringence, and is inserted, as a discrete component, in an optical system. Therefore, the following problems are posed, for example:

(1) In order to convert the polarization state of one light beam, a mechanism for rotating or moving the wave plate is required. In addition, the conversion speed is low.

(2) With a reduction in the size of the optical system, a cumbersome positioning operation is required for assembly, resulting in an increase in the cost of the optical system.

SUMMARY OF THE INVENTION

It is, therefore, a principal object of the present invention to provide a semiconductor laser apparatus which can easily select polarization in the TE or TM mode.

It is another object of the present invention to provide a semiconductor laser apparatus which can easily select polarization in the TE or TM mode without using special components.

It is still another object of the present invention to apply the semiconductor laser apparatus of the present invention to an information recording/reproducing apparatus, an optical sensor, an optical encoder, or a display apparatus so as to provide an apparatus smaller in size than a conventional apparatus.

In order to achieve the above objects, the gain of the TM mode is increased by using a quantum well structure having a tensilely strain for the active layer, and the loss difference and gain difference between the TE and TM modes are switched in magnitude by dividing a current injection region between resonator mirrors, thereby allowing selection of polarization in the TE or TM mode.

According to an aspect of the present invention, there is provided a semiconductor laser apparatus comprising a semiconductor substrate having a first electrode on one surface, a first cladding layer formed on the other surface of the semiconductor substrate, an active layer placed on the cladding layer, a second cladding layer placed on the active layer, a second electrode placed on the second cladding layer, and a pair of resonator mirrors placed in a waveguide direction perpendicular to the surfaces of the semiconductor substrate to oppose each other, wherein the active layer is constituted by a quantum well layer having a tensilely strain, and the second electrode is separated into portions not less than two portions.

With this arrangement, the oscillation mode of the apparatus is changed by selecting the numbers of the current injection electrodes, thereby producing oscillation either in the TE mode or in the TM mode.

BRIEF DESCRIPTION OF THE DRAWINGS

FIGS. 3A, 3B, and 3C show the third embodiment of the present invention, in which FIG. 3A is a sectional view taken along a line 3A–3A' in FIG. 3C, FIG. 3B is a sectional view taken along a line 3B–3B' in FIG. 3C, and FIG. 3C is a plan view;

FIGS. 7A to 7D are timing charts for explaining the operation of the embodiment in FIG. 5;

FIG. 22 is a system diagram showing an embodiment in which the semiconductor laser apparatus of the present invention is applied to a display unit;

FIG. 23 is a view for explaining the relationship between a screen for a scanning beam, polarizing spectacles, and parallax in order to explain an operation of the embodiment in FIG. 22;

FIGS. 25A–25D are timing charts for explaining the operation of the circuit in FIG. 24;

DESCRIPTION OF THE PREFERRED EMBODIMENTS

Figure 1:
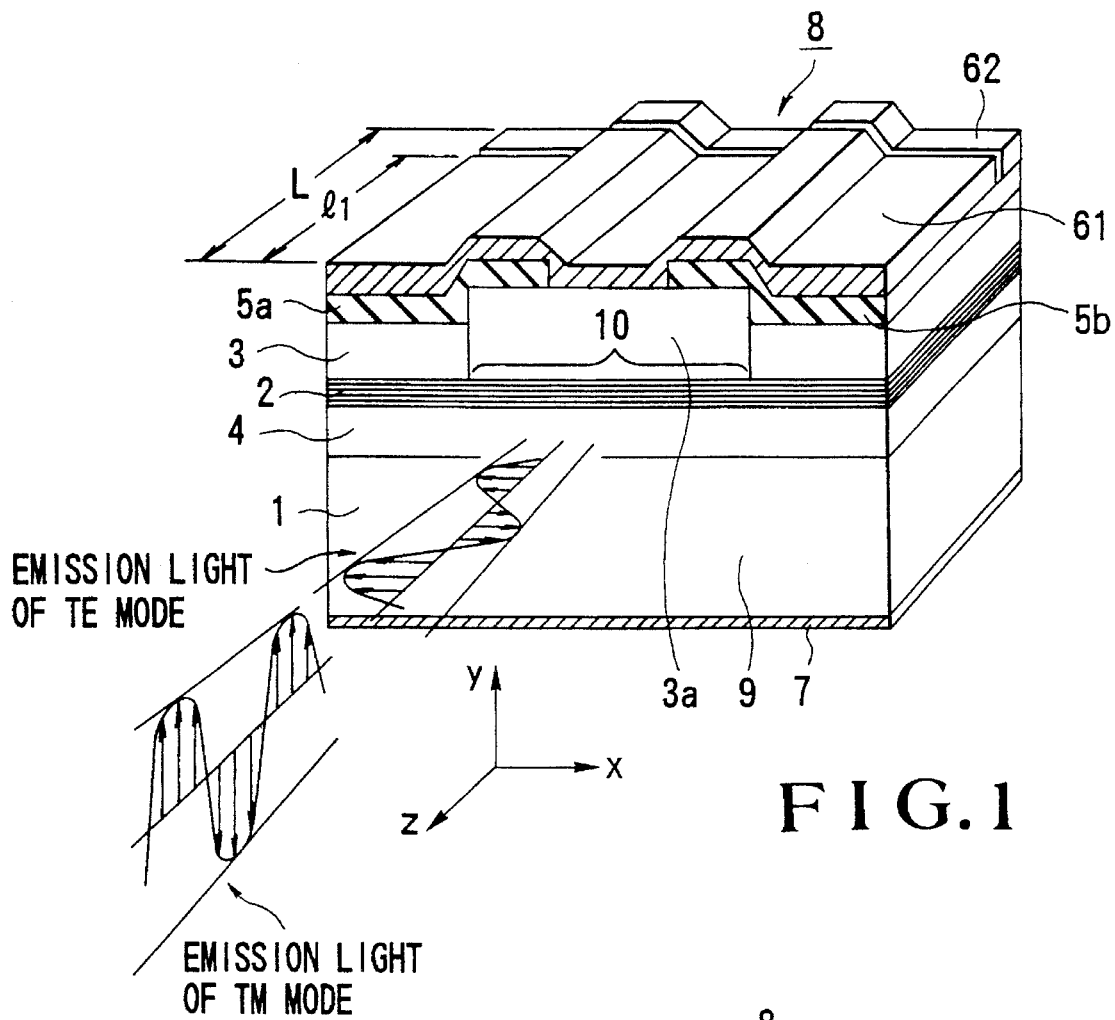
FIG. 1 is a perspective view showing the arrangement of a semiconductor laser apparatus according to the first embodiment of the present invention.
Figure 29A:
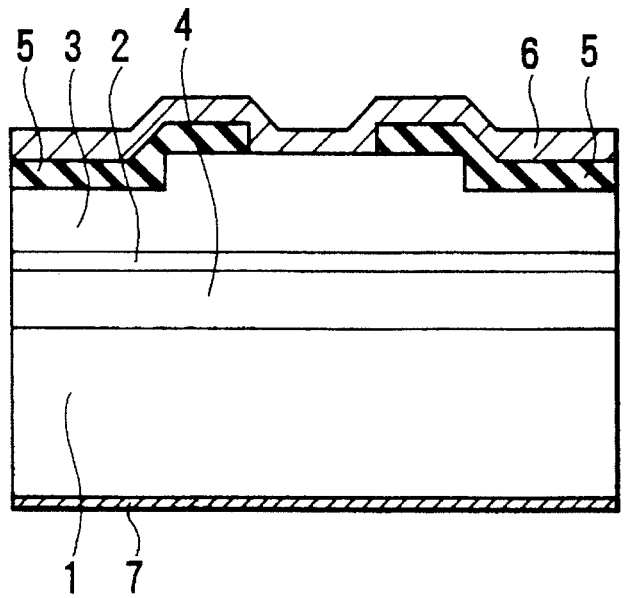
FIGS. 29A and 29B are views for explaining a conventional semiconductor laser apparatus.
Figure 29B:
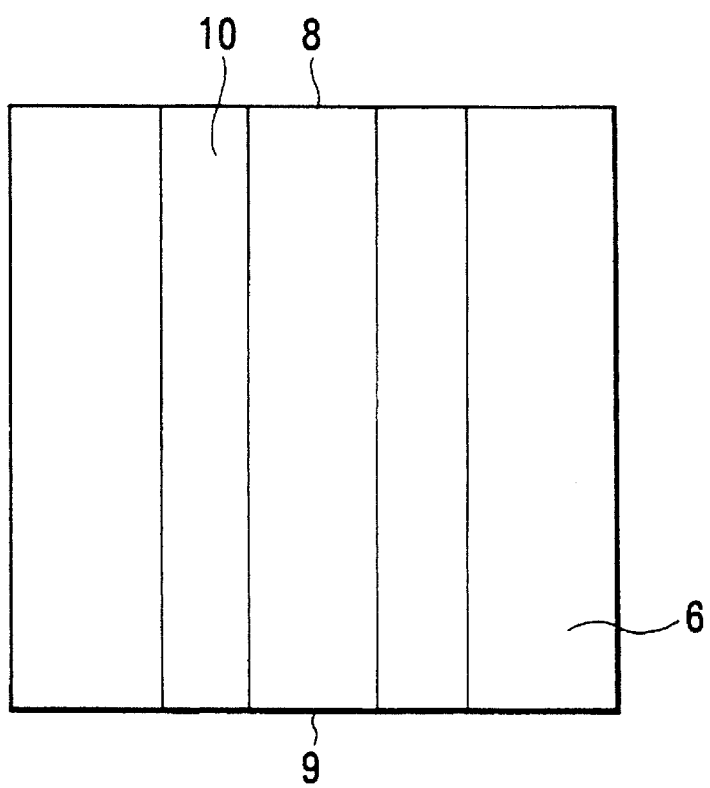

FIG. 1 shows a semiconductor laser apparatus according to the first embodiment of the present invention. The same reference numerals in FIG. 1 denote the same parts or parts having the same functions as in FIGS. 29A and 29B.

Referring to FIG. 1, a lower AlGaAs cladding layer 4, a GaAsP/AlGaAs strain quantum well active layer 2 located on the cladding layer 4, and an upper AlGaAs cladding layer 3 located on the active layer 2 are sequentially formed on a GaAs semiconductor substrate 1. $SiO_2$ insulating layers 5a and 5b for current constriction are formed on the upper cladding layer 3. Upper Au electrodes 61 and 62 and a lower Au electrode 7 are formed to sandwich the GaAs semiconductor substrate 1, the AlGaAs cladding layer 4, the GaAsP/AlGaAs strain quantum well active layer 2, the AlGaAs cladding layer 3, and the $SiO_2$ insulating layers 5a and 5b. In this case, a central portion 3a of the upper surface of the AlGaAs cladding layer 3 protrudes in one direction to form a refractive index waveguide, and the $SiO_2$ insulating layers 5a and 5b are spaced apart from each other and extend along this protruding portion 3a. The upper electrodes 61 and 62 are spaced apart from each other and extend in a direction (perpendicular to the portion 3a, in this case) crossing the portion 3a of the cladding layer 3.

Note that the portion 3a of the upper AlGaAs cladding layer 3 constitutes an optical waveguide stripe 10 for confining light propagating in a direction parallel to an optical waveguide in the active layer 2 located under the portion 3a.

With this arrangement, the opposing side surfaces arranged in a direction perpendicular to the portion 3a serve as resonator mirrors 8 and 9, respectively. In addition, the resonator mirrors 8 and 9 constitute a Fabry-Perot resonator together with the members formed perpendicularly on the GaAs semiconductor substrate 1 and located between the resonator mirrors 8 and 9. The portion 3a of the upper AlGaAs cladding layer 3 is formed into the optical waveguide stripe 10 to realize confinement of light propagating in a direction parallel to the optical waveguide.

Light emitted upon injection of a current through the upper electrodes 61 and 62 is guided to the optical waveguide stripe 10 to reciprocate between the resonator mirrors 8 and 9, thus causing laser oscillation.

In this case, total gains $G_{TE}$ and $G_{TM}$ respectively obtained, in the TE and TM modes, from a given injected current within a resonator length L are represented by the following equations:

$$G_{TE} = g_{TE}L - \alpha_{TE}L - \ln(1/R_{TE})$$

$$G_{TM} = g_{TM}L - \alpha_{TM}L - \ln(1/R_{TM})$$

where $g_{TE}$ is the gain obtained from the injected current in the TE mode, $g_{TM}$ is the gain obtained from the injected current in the TM mode, $\alpha_{TE}$ is the waveguide loss per unit length in the TE mode, $\alpha_{TM}$ is the waveguide loss per unit length in the TM mode, $R_{TE}$ is the reflectance of each resonator mirror in the TE mode, and $R_{TM}$ is the reflectance of each resonator mirror in the TM mode. In a normal description, $G_{TE}$ ($G_{TM}$)<0 represents a non-oscillation state; and $G_{TE}$ ($G_{TM}$)≧0, an oscillation state. If oscillation can be produced in the two modes, oscillation is produced in one of the modes which ensures a higher gain, while oscillation in the other mode is suppressed.

With a given injected current, therefore, if the total gain $G_{TE}$ is higher than the total gain $G_{EM}$, oscillation is mainly produced in the TE mode, and vice versa. This operation is expressed as follows:

$$G=G_{TE}-G_{TM}=(g_{TE}-g_{TM})L-(\alpha_{TE}-\alpha_{TM})L-(ln(1/R_{TE})-ln(1/R_{TM}))$$

If G>0, then oscillation is produced in the TE mode.
If G<0, then oscillation is produced in the TM mode.
In this case, if the length of the upper electrode 61 is represented by l, and the total length of the upper electrodes 61 and 62 is represented by L, (L>l), $$G=(g_{TE}-g_{TM})l-(\alpha_{TE}-\alpha_{TM})L-(ln(1/R_{TE})-ln(1/R_{TM}))$$

In the case of a Fabry-Perot resonator, $$R_{TE}>R_{TM}$$

As disclosed in M. J. B. Boermans, S. H. Hagen, A. Valster, M. N. Finke, J. M. M. Van Der Heyden et al., "Investigation of TE and TM polarized laser emission in GaInP/AlGaInP lasers by growth-controlled strain", Electron. Lett., Vol. 26, p. 1438, 1990, if the tensilely strain amount of the quantum well layer of the active layer is controlled, recombination of electrons in a conduction band and light holes in a valence band becomes dominant. As a result, the following relation can be established:

$$g_{TE}<g_{TM}$$

In addition, since internal losses in the TE and TM modes are almost the same, $$\alpha_{TE}=\alpha_{TM}$$

(Even if the losses are not the same, the following argument can be sustained by causing the difference in loss to cancel out the difference in reflectance.) When a current is injected into only the electrode 61 (length l)

$$G=(g_{TE}-g_{TM})l-(ln(1/R_{TE})-ln(1/R_{TM}))>0$$

thus producing oscillation in the TE mode. When a current is injected into both the upper electrodes 61 and 62 (total length L), $$G=(g_{TE}-g_{TM})L-(ln(1/R_{TE})-ln(1/R_{TM}))<0$$

thus producing oscillation in the TM mode. Therefore, by selectively injecting a current into one or both of the electrodes, the difference in gain between the two modes is mainly changed to allow selection of the TE or TM mode.

The following are examples of numerical values for such an operation:

Assume that $R_{TE}=35\%$, $R_{TM}=30\%$, and $g_{TE}-g_{TM}=-10$ cm$^{-1}$. In this case, if l<154 µm, then G>0, and oscillation is produced in the TE mode. If L>154 µm, then G<0, and oscillation is produced in the TM mode.

Figure 2:
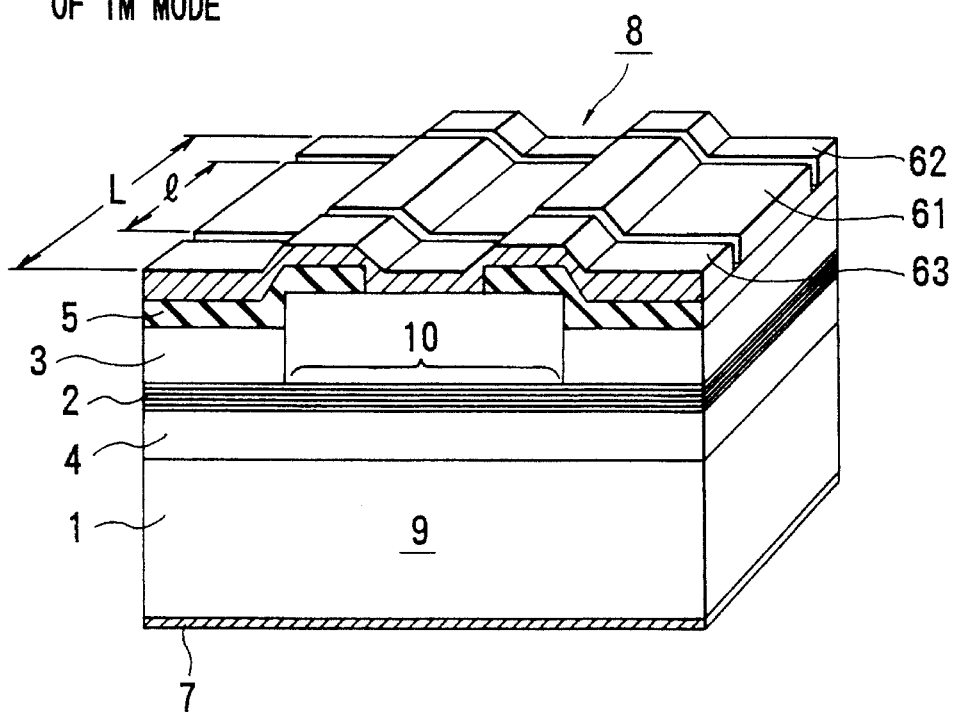
FIG. 2 shows a perspective view of the second embodiment of the present invention.

FIG. 2 shows the second embodiment of the present invention. The second embodiment is different from the first embodiment in that a current injection region is divided into three portions or more. For this purpose, upper electrodes 61, 62, and 63 are formed to be spaced apart from each other.

Figure 3A:
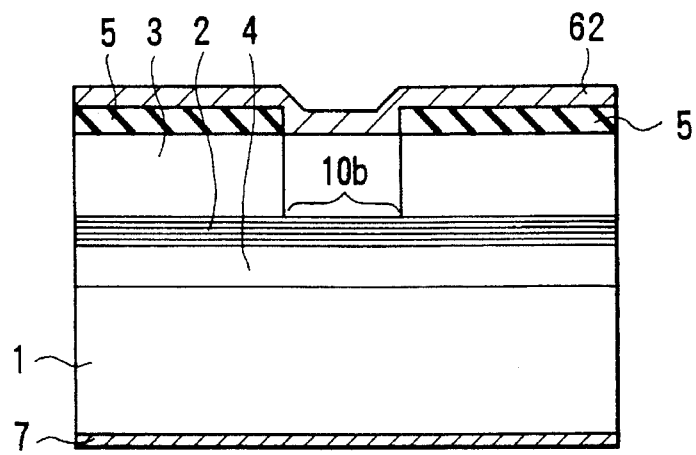
Figure 3B:
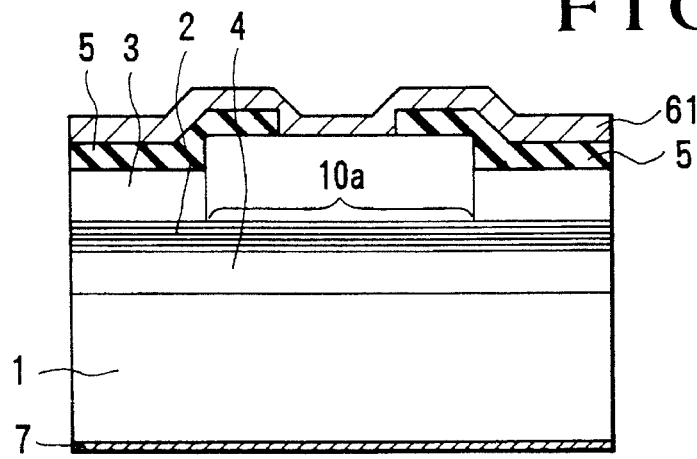

FIG. 3 shows the third embodiment of the present invention, in which a strain is applied to an active layer in advance such that the gains of the TE and TM modes become equal to each other. The third embodiment is characterized in that one (an upper electrode 62) of the divided current injection regions has no refractive index waveguide in a direction parallel to the substrate. For this reason, although a gain waveguide 10b is formed while a current is injected, no waveguide is formed while no current is injected. Therefore, light which propagates in this region while a current is injected becomes almost parallel light. While no current is injected, the light becomes divergent light and is reflected by a resonator mirror 8. In consideration of the Fresnel reflection formula, in this case, the reflectance of parallel light is higher than that of divergent light in the TE mode, whereas the reflectance of divergent light is higher than that of parallel light in the TM mode.

The above description will be summarized below. The reflection loss difference between the two modes is changed according to the presence/absence of a current injected into the upper electrode 62. When a current is injected to form a gain waveguide, oscillation is produced in the TE mode. When no current is injected, oscillation is produced in the TM mode.

Figure 4:
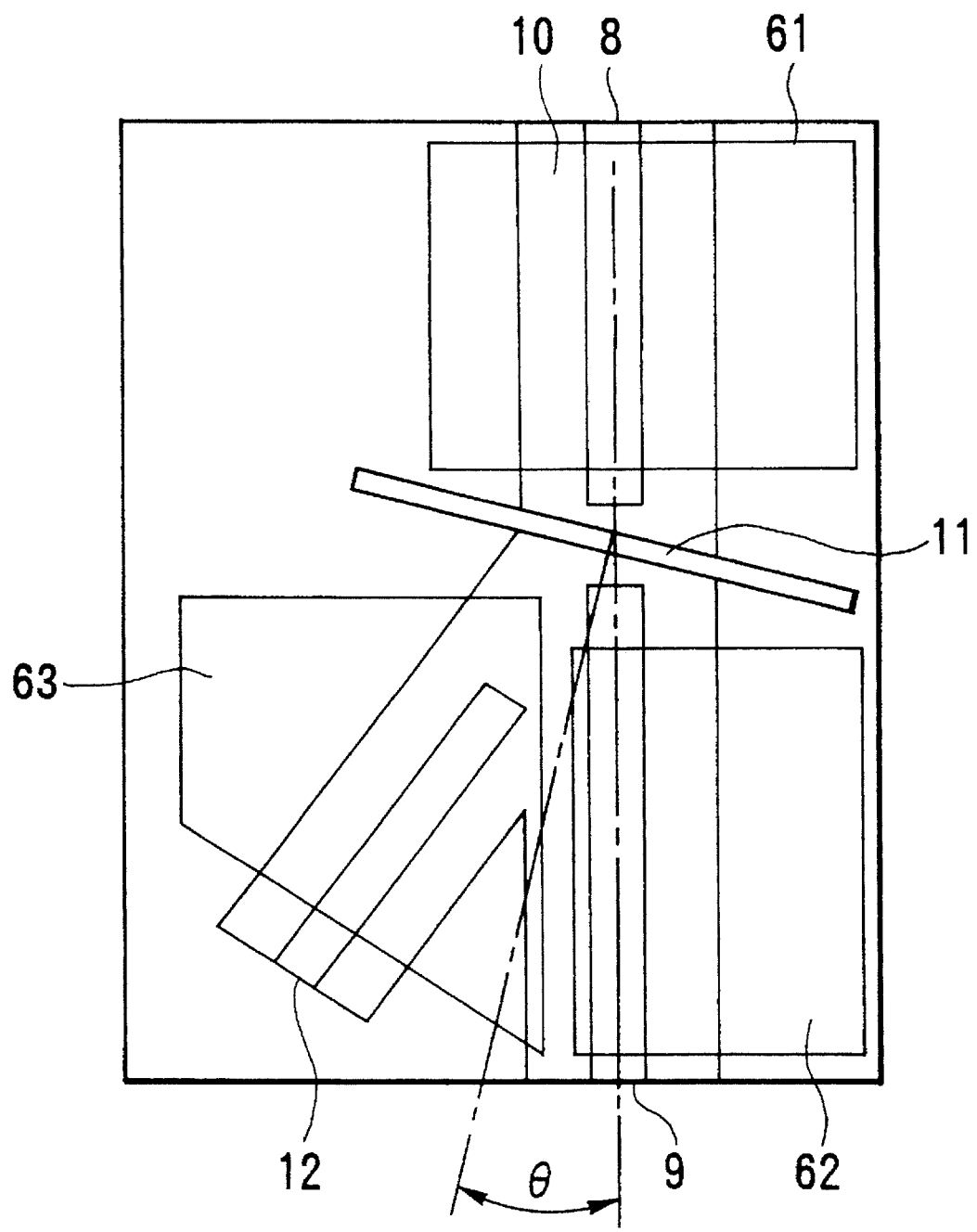
FIG. 4 is a plan view for explaining the structure of a semiconductor laser apparatus according to the fourth embodiment of the present invention.

FIG. 4 shows the fourth embodiment of the present invention, in which a strain is applied to an active layer in advance such that the gains of the TE and TM modes become equal to each other. The fourth embodiment is characterized in that a reflecting surface 11 is formed in a waveguide. The reflecting surface 11 formed in the waveguide is inclined with respect to an optical axis perpendicular to resonator mirrors 8 and 9 at a Brewster angle θ of the TE mode. Therefore, the reflectance of the TE mode at the reflecting surface 11 becomes 0. In this case, when a current is injected into upper electrodes 61 and 62, the TE mode can reciprocate between the resonator mirrors 8 and 9 without undergoing a reflection loss at the reflecting surface 11, whereas the TM mode undergoes a reflection loss of 30% or more at the reflecting surface 11. In this case, oscillation is produced in the TE mode. In contrast to this, when a current is injected into the upper electrode 62 and an upper electrode 63, the TM mode can reciprocate between the resonator mirror 9 and a resonator mirror 12 while it is reflected by the reflecting surface 11 by 30% or more, whereas the TE mode undergoes a reflection loss of 100% at the reflecting surface 11. In this case, oscillation is produced in the TM mode.

In the first to fourth embodiments, GaAsP/AlGaAs-based materials are used for the respective active layers. However, it is apparent that other strain superlattice materials such as GaInp/AlGaInP- and GaInAs/GaInAsP-based materials can be used to obtain the same effects as those described above.

As described above, the semiconductor laser apparatus of the present invention has the following unique effects:

(1) Polarization can be switched between the TE and TM modes by only changing the regions in which a current is injected without using a rotating or moving mechanism. Therefore, the conversion speed is much higher than that in the conventional apparatus.

(2) A reduction in size and weight can be achieved to the same degree as that of the conventional semiconductor laser apparatus.

(3) Since the apparatus of the present invention can be manufactured by adding simple steps, e.g., separation of electrodes, to the manufacturing process of the conventional semiconductor laser apparatus, an increase in the cost of an optical system can be minimized.

Figure 5:
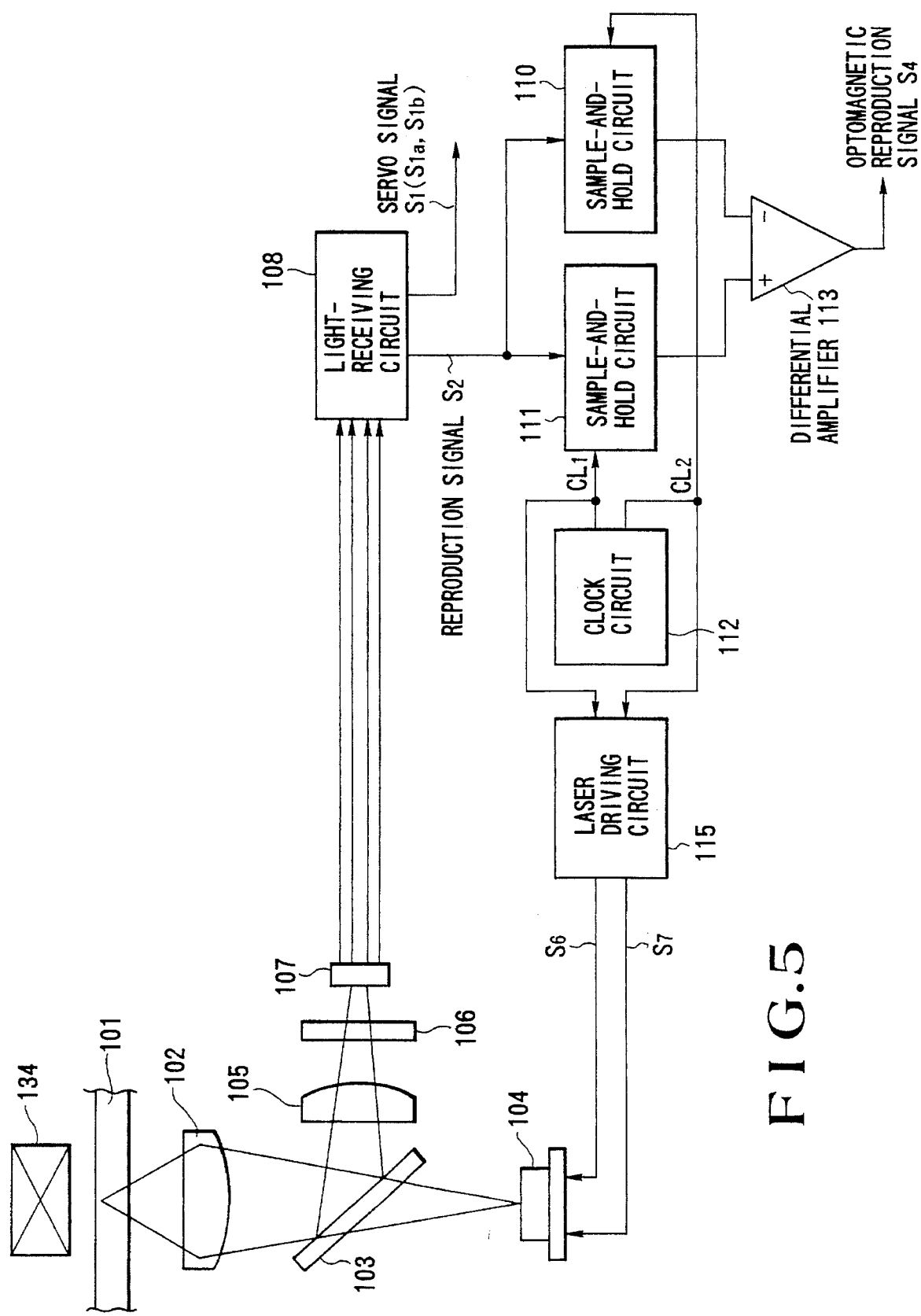
FIG. 5 is a system diagram showing an embodiment in which the semiconductor laser apparatus of the present invention is applied to an optical information recording/reproducing apparatus.

FIG. 5 shows the fifth embodiment of the present invention, in which the above-described semiconductor laser apparatus is applied to an optical information recording/reproducing apparatus. Referring to FIG. 5, reference numeral 101 denotes an magneto-optical disk; 102, an objective lens; 103, a beam splitter; and 104, a TE/TM mode control semiconductor laser according to the first embodiment of the present invention described with reference to FIG. 1. In addition, reference numeral 105 denotes a cylindrical lens; 106, a polarizer/analyzer, a 107, a photodiode; 108, a light-receiving circuit for obtaining a servo signal S1 and a reproduction signal from a signal detected by the photodiode 107; 112, a clock circuit for supplying clock outputs CL1 and CL2 of opposite phases shown in FIGS. 7A and 7B, respectively; 110 and 111, sample-and-hold circuits for receiving the outputs from the light-receiving circuit 108 to sample/hold them on the basis of the clock outputs CL1 and CL2, respectively; 113, a differential amplifier for obtaining an magneto-optical reproduction signal S4 from the output difference between the sample-and-hold circuits 110 and 111; 115, a laser driving circuit for supplying signals S6 and S7 (FIGS. 7A and 7B) for driving the semiconductor laser 104 on the basis of the clock outputs CL1 and CL2; and 134, a bias magnet. Note that reference symbols $t_1$, $t_2$, ... , $t_n$, $t_{n+1}$, ... in FIG. 7 denote the timings of the respective clock pulses.

Figure 9:
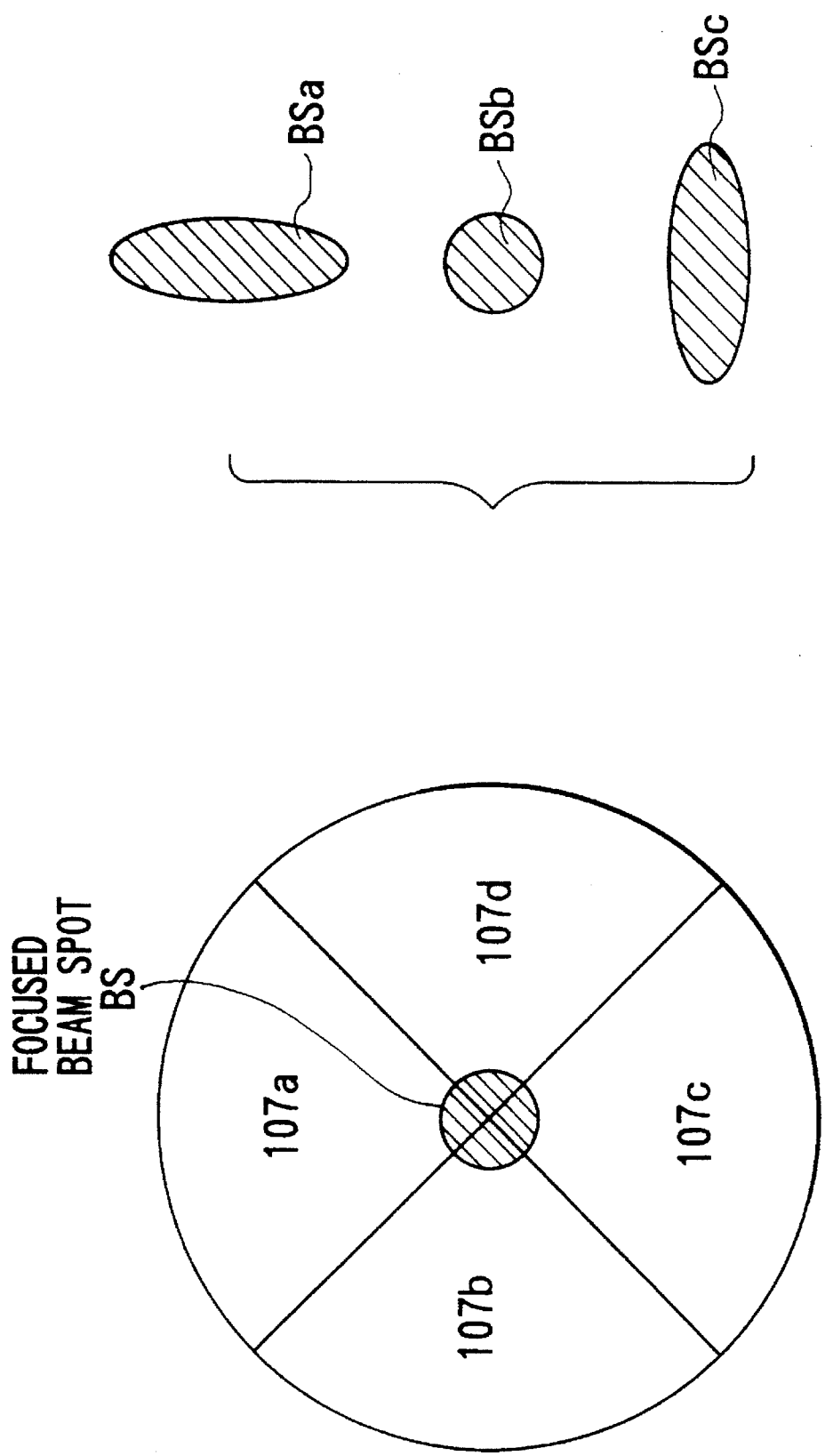
FIG. 9 is a view for explaining an operation of a photodiode in FIG. 5.

The photodiode 107 used in this case is divided into four elements 107a, 107b, 107c, and 107d, for example, as shown in FIG. 9. The sum of outputs from these photodiode elements 107a to 107d is supplied to the light-receiving circuit 108.

Figure 10:
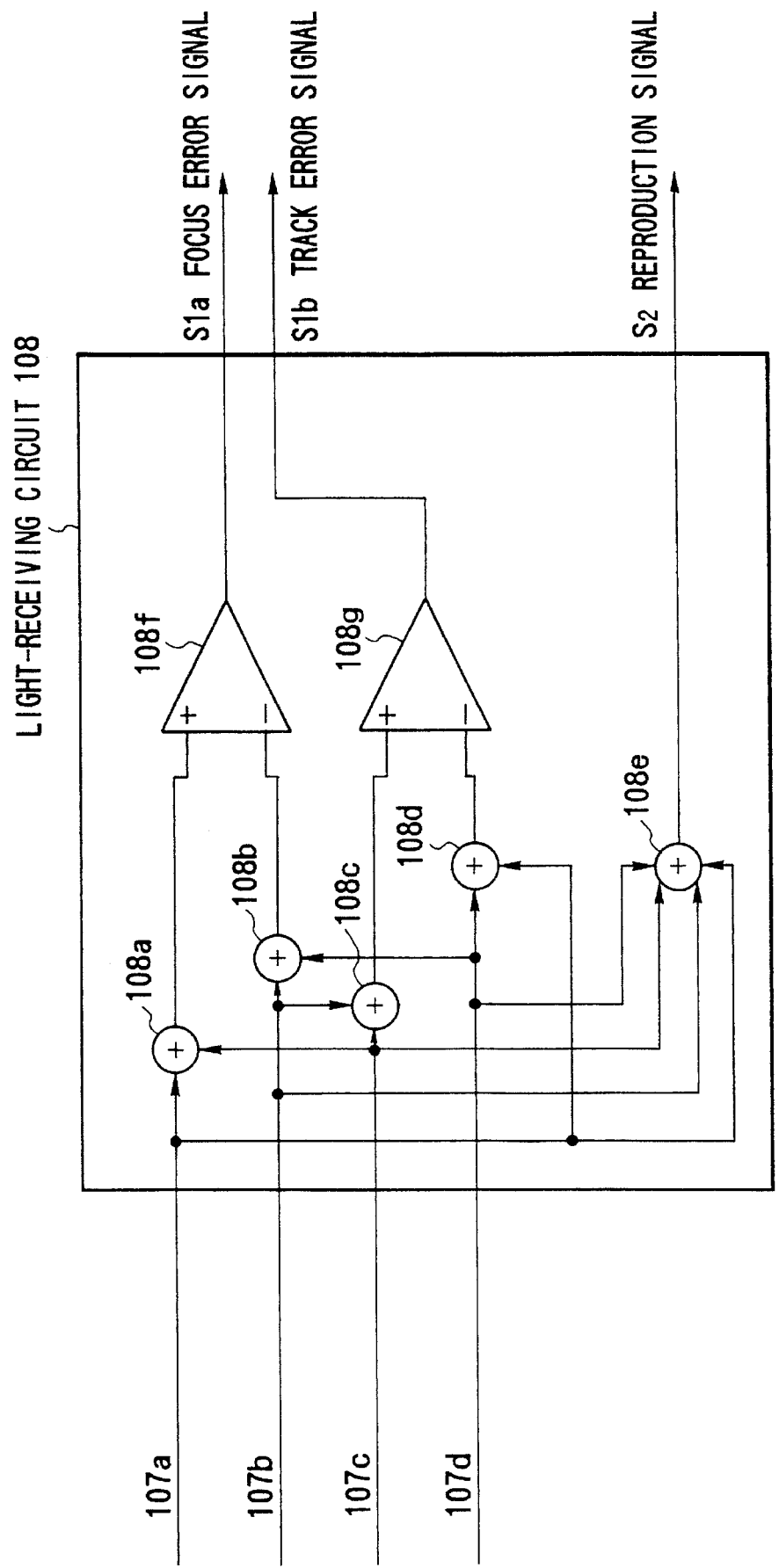
FIG. 10 is a system diagram showing a detailed arrangement of a light-receiving circuit in FIG. 5.

As shown in FIG. 10, for example, the light-receiving circuit 108 is constituted by a plurality of operation elements such as AND gates 108a to 108e and operational amplifiers 108f and 108g. The light-receiving circuit 108 receives outputs from the elements 107a to 107d of the photodiode 107 and arithmetically processes them to output servo signals S1, e.g., a focus error signal S1a and a track error signal S1b, and a reproduction signal S2.

If the photodiode 107 and the light-receiving circuit 108 respectively shown in FIGS. 9 and 10 are used, a reproduction signal S4 output from the differential amplifier 113 becomes an output proportional to the total amount of light received by the photodiode 107.

The focus error signal S1a extracted by the light-receiving circuit 108 is detected as follows. The shape of a focused beam spot changes depending on the defocus amount of the objective lens 102 with respect to the magneto-optical disk 101. More specifically, as shown in FIG. 9, the shapes denoted by reference symbols BSa, BSb, and BSc appear when the defocus amount is positive, zero, and negative, respectively. Such a defocus amount is detected as the focus error signal S1a by a focus detection optical system based on an astigmatism method using the cylindrical lens 105 on the basis of the difference between the sum signal of the signals from the photodiode elements 107a and 107c and that from the elements 107b and 107d.

The track error signal S1b is obtained from the difference between the sum signal of the signals from the elements 107b and 107c and that from the elements 107a and 107d.

In this case, the polarizing direction of the polarizer/analyzer 106 is set at 45° with respect to TE/TM mode polarized light.

In this arrangement, light which is emitted when a current is injected into upper electrodes 61 and 62 is guided to an optical waveguide stripe 10 and reciprocates between resonator mirrors 8 and 9, thus producing laser oscillation.

Assume that the total gains obtained, in the TE and TM modes, from a given injected current within a resonator length L are respectively represented by $G_{TE}$ and $G_{TM}$; and the difference ($G_{TE}-G_{TM}$), G. In this case, when the difference G is positive, oscillation is produced in the TE mode, whereas when the difference G is negative, oscillation is produced in the TM mode. If the gains obtained from the injected current in the respective modes are represented by $g_{TE}$ and $g_{TM}$, respectively; the waveguide losses per unit length in the respective modes; $\alpha_{TE}$ and $\alpha_{TM}$, and the reflectances of the respective resonator mirrors in the respective modes, $R_{TE}$ and $R_{TM}$, the value of the difference G is given by $$G=(g_{TE}-g_{TM})\times X-(ln(1/R_{TE})-ln(1/R_{TM}))$$

where x is the length of a current injection region, l is the length required for the TE mode oscillation, with which G>0, and L is the length required for the TM mode oscillation, with which G<0.

For example, if $R_{TE}$=35%, $R_{TM}$=30%, and $g_{TE}-g_{TM}$=−10 cm$^{-1}$, then l<154 μm.

Figure 6:
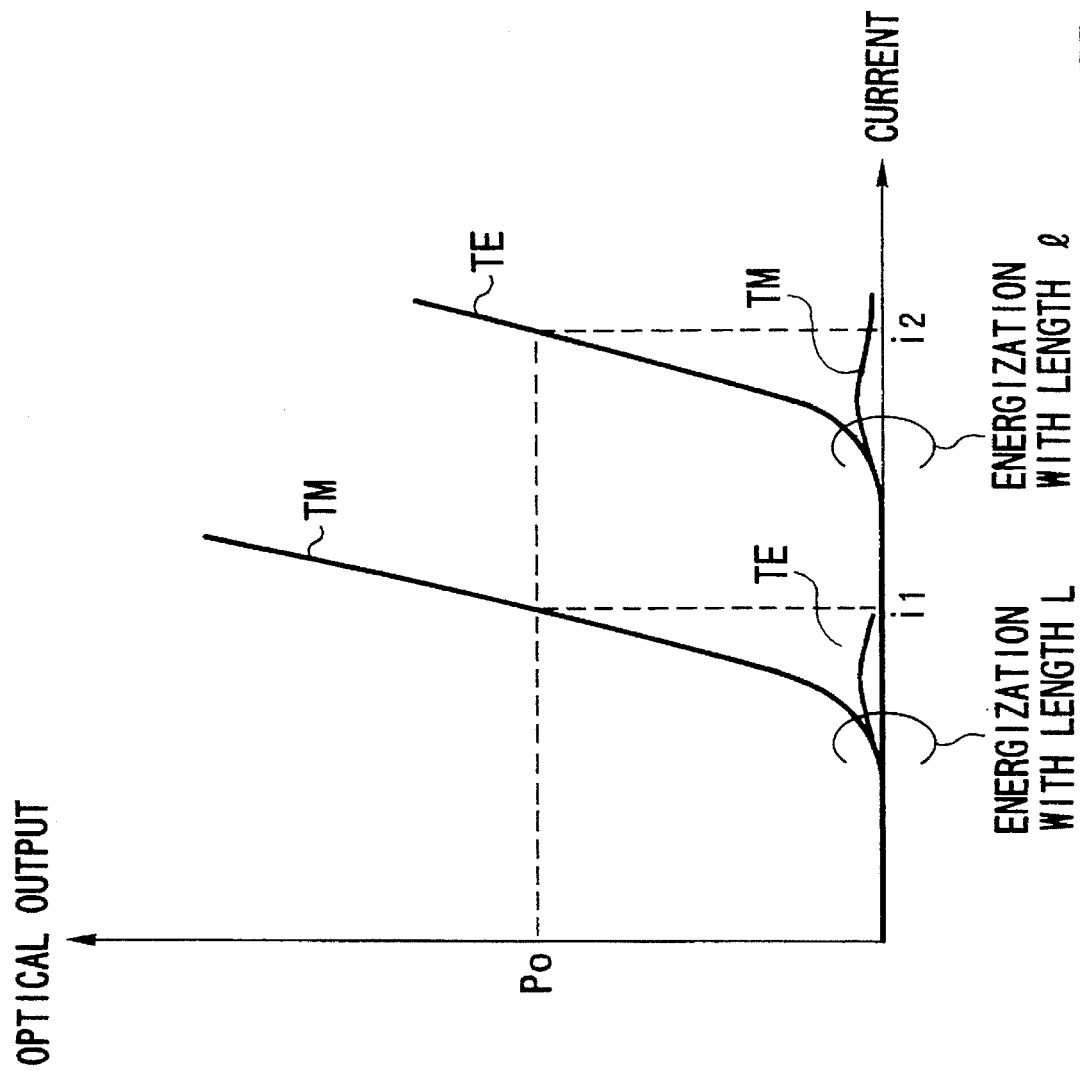
FIG. 6 is a graph showing optical output-current characteristics to explain an operation of the embodiment in FIG. 5.

FIG. 6 shows examples of selective oscillation in the TE and TM modes, in which an injected current is plotted along the abscissa, and an optical output is plotted along the ordinate, representing a result obtained by measuring outputs in the TE and TM modes when currents are injected with the lengths L and l, respectively.

Accordingly, light having different polarization states in the TE and TM modes can be extracted while an optical output $P_0$ is kept constant, by controlling the current injection regions L and l and magnitudes $i_1$ and $i_2$ of the injected currents.

When oscillation is to be produced in the TM mode, a current is injected into the upper electrodes 61 and 62. According to the characteristics shown in FIG. 6, the output $P_0$ of the TM mode can be obtained with the magnitude $i_1$ of the current.

When oscillation is to be produced in the TE mode, a current is injected into only the upper electrode 61. According to the characteristics shown in FIG. 6, the output $P_0$ of the TE mode can be obtained with the magnitude $i_2$ of the current.

When oscillation is alternately produced in the TM and TE modes, a current S6 supplied to the electrode 62 and a current S7 supplied to the electrode 61 are controlled. More specifically, for TM mode oscillation, a current of the magnitude $i_1$ as the sum of both the currents S6 and S7 is supplied to the electrodes 61 and 62. For TE mode oscillation, only the current S7 of the magnitude $i_2$ is supplied to the electrode 61. For example, at a timing $t_n$ in FIGS. 7A to 7D, a current is injected into only the electrode 61, and hence the semiconductor laser 104 oscillates in the TE mode.

This operation will be described below with reference to the relationship between each recording mark on the disk 101 and a beam spot shown in FIG. 8. Reference numeral 130 denotes a track on the magneto-optical disk 101; 131, magnetic recording marks on the track 130; 132, a beam spot; and 133, the polarizing direction of the beam spot 132.

Figure 8:
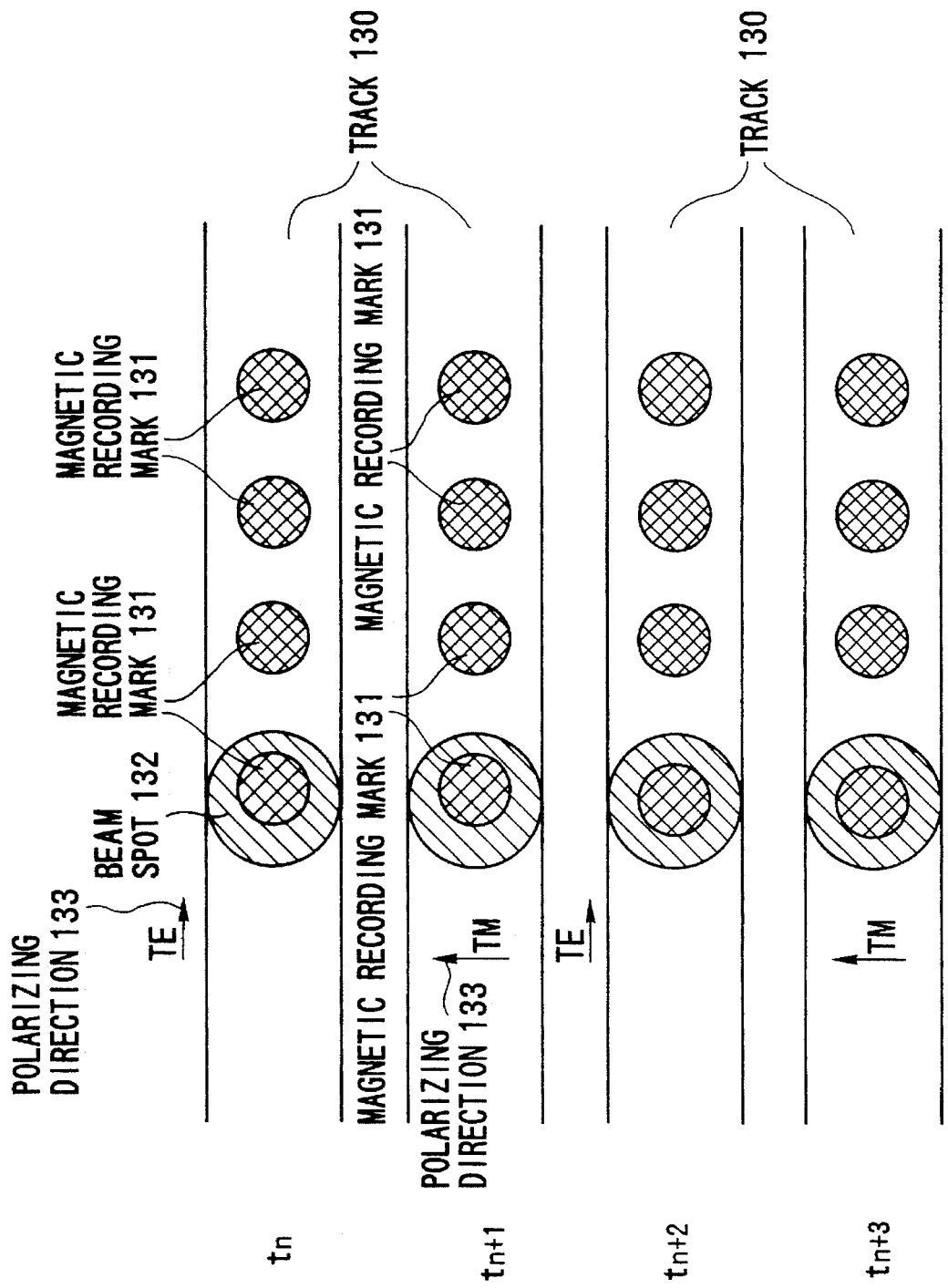
FIG. 8 is a view for explaining polarizing and reading operations of the semiconductor laser apparatus in order to explain the operation of the embodiment in FIG. 5.

The interval between the timings $t_n$, ... , $t_{n\pm}$ in FIG. 8 is sufficiently shorter than the moving time of the recording marks 131 upon rotation of the disk 101 so that the relative positions of the beam spot 132 and the magnetic recording mark 131 only slightly change during the repeating interval of the polarizing direction 133 in the TE and TM modes.

Assume that a 1-μm long recording mark on the disk 101 which is rotating at a peripheral speed of 2 m/s is read with the repeating frequency of the TE and TM modes being set to be 200 MHz. In this case, since the scanning time for 1 μm is 500 ns, and the mode time interval is 5 ns, signal reproduction in the TE and TM modes for one mark can be performed by 100 repetitions.

As described above, reproduction signals S2 in the TE and TM modes can be sampled by the sample-and-hold circuits 110 and 111 at a repeating interval sufficiently shorter than the scanning time of the beam spot 132 with respect to the magnetic recording mark 131, and a differential signal, i.e., an optomagnetic reproduction signal S4, can be obtained by the differential amplifier 113.

Figure 11:
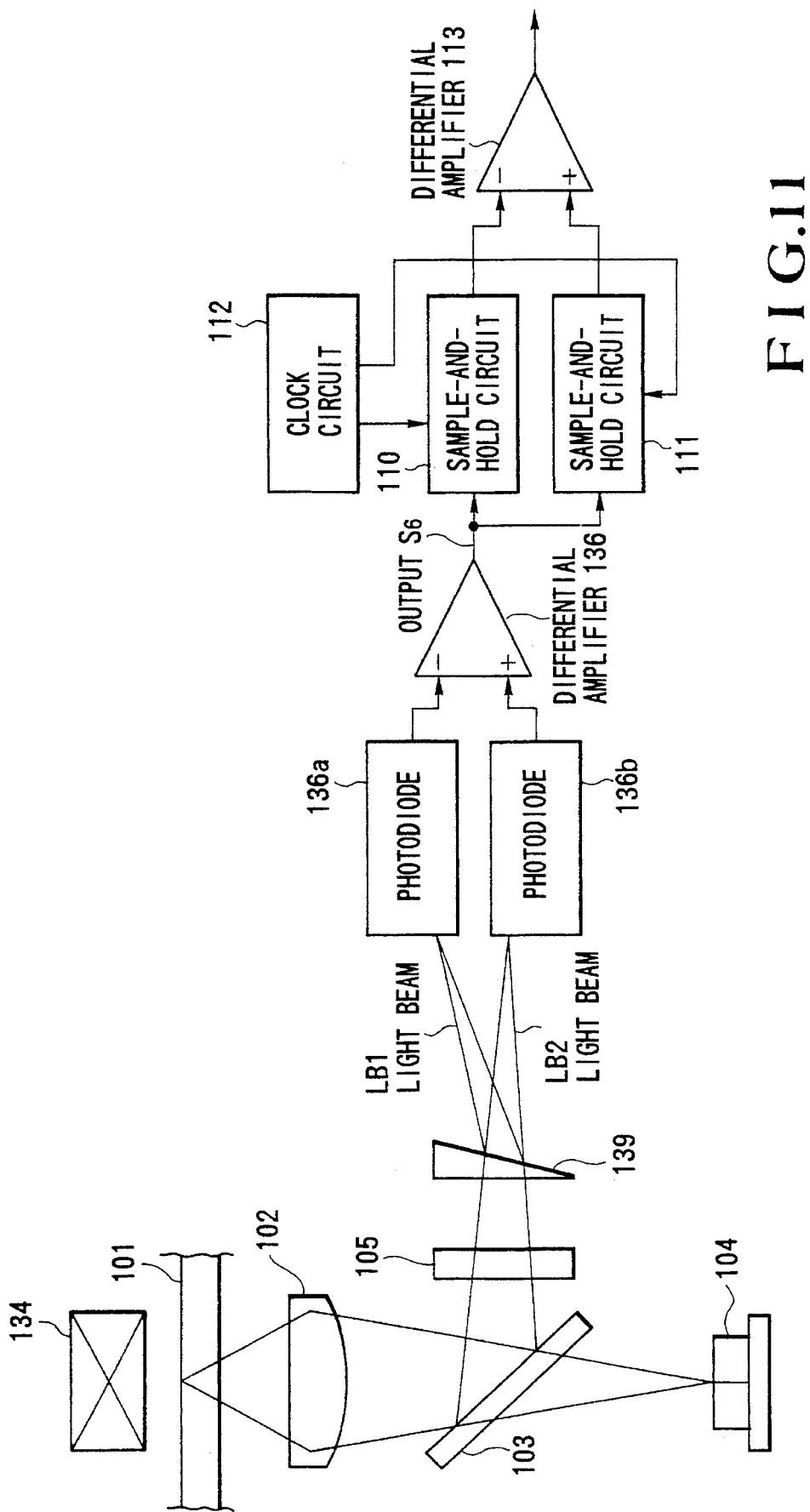
FIG. 11 is a system diagram showing another embodiment in which the semiconductor laser apparatus of the present invention is applied to an optical information recording/reproducing apparatus.

FIG. 11 shows another embodiment of the present invention, in which a birefringent prism is used in place of the polarizer/analyzer 106. The same reference numerals in FIG. 11 denote the same parts as in FIG. 5. Referring to FIG. 11, reference numeral 139 denotes a birefringent prism arranged after a cylindrical lens 105; 136a and 136b, photodiodes arranged after the birefringent prism 139 and designed to receive light beams LB1 and LB2; and 136, a differential amplifier for receiving outputs from the photodiodes 136a and 136b.

The direction of the crystallographic axis of the birefringent prism 139 is set such that when light beams of the TE and TM modes are incident, the amounts of the light beams LB1 and LB2 divided by the birefringent prism 139 becomes almost the same.

Light reception outputs ia and ib from the photodiodes 136a and 136b in the TE and TM modes with respect to a Kerr rotation θ are analyzed by a Jones matrix in the same manner as described above. The following are the analysis results:

$$|ia(TE)|^2 = R/4 \cdot (1-SIN2\theta)$$

$$|ib(TE)|^2 = R/4 \cdot (1+SIN2\theta)$$

$$|ia(TM)|^2 = R/4 \cdot (1+SIN2\theta)$$

$$|ib(TM)|^2 = R/4 \cdot (1-SIN2\theta)$$

If, therefore, outputs S6 from the differential amplifier 136 in the TE and TM modes are respectively represented by $i'_{TE}$ and $i'_{TM}$, then $$i'_{TE} = (R/2)SIN2\theta$$

$$i'_{TM} = (R/2)SIN2\theta$$

The outputs S6 from the differential amplifier 136 are supplied to sample-and-hold circuits 110 and 111 to be sampled/held. If a differential output $S4 = (i'_{TE} - i'_{TM})$ based on the difference between reproduction signals in the TE and TM modes, obtained by further supplying the outputs S6 to a differential amplifier 113, is represented by $i''_{MO}$, the following equation can be established:

$$i''_{MO} = RSIN2\theta$$

As is apparent from the above analysis, in this embodiment, detection of the Kerr rotation θ can also be performed by using magneto-optical recording marks.

Since the embodiment shown in FIG. 11 uses the birefringent prism 139 in place of the polarizer/analyzer, the amount of light used for light reception can be set to be large, and hence the embodiment is effective when a high S/N ratio is required against circuit noise or the like, as compared with the fifth embodiment.

In this case, the embodiment shown in FIG. 11 uses a triangular prism consisting of a birefringent material as the birefringent prism. It is, however, apparent that the same effects can be obtained even with a polarizing prism formed by bonding Wollaston prisms to each other.

Referring to FIG. 5, assume that in a case wherein information is recorded while a magnetic field is generated by the bias magnet 134, and the temperature of the optomagnetic medium is raised to the Curie temperature or more to invert the magnet domains of the medium. It is apparent, even in this case, that a writing operation with respect to the magneto-optical disk can be performed regardless of whether the laser output is increased in the TE or TM mode.

Figure 12:
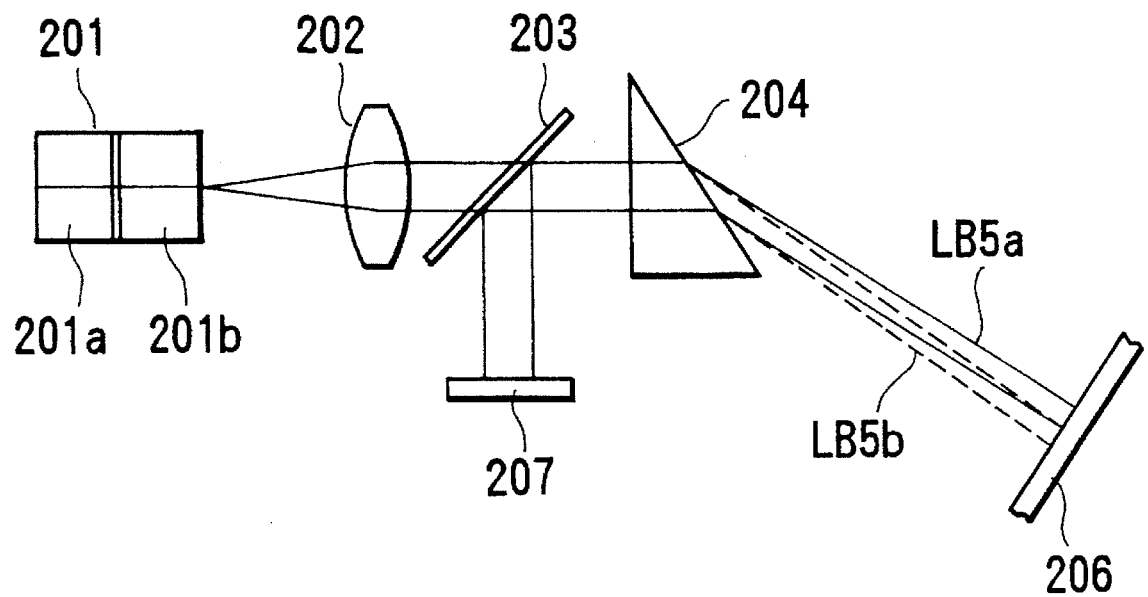
FIG. 12 is a system diagram showing an embodiment in which the semiconductor laser apparatus of the present invention is applied to an optical sensor.
Figure 13:
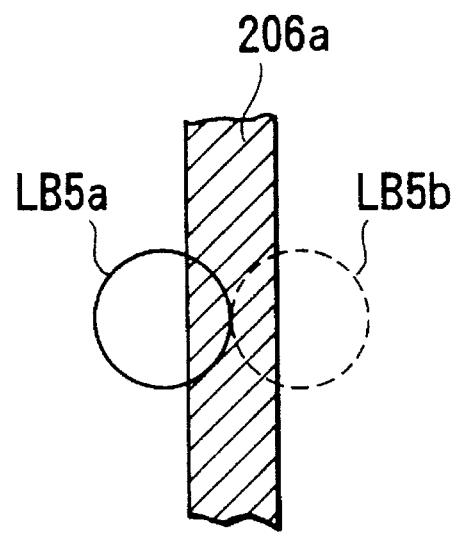
FIG. 13 is a view for explaining an operation of the embodiment in FIG. 12.

FIGS. 12 and 13 show an embodiment in which the present invention is applied to an optical sensor.

Referring to FIGS. 12 and 13, reference numeral 201 denotes a semiconductor laser apparatus capable of oscillation control in the TE and TM modes according to the present invention, which apparatus is shown in detail in FIGS. 1 to 4; 201a and 201b, electrodes of the semiconductor laser apparatus 201; 202, a lens for receiving light from the semiconductor laser apparatus 201; 203, a beam splitter arranged after the lens 202; 204, a birefringent prism arranged between the beam splitter 203 and a target object to be measured; 206, a target object for receiving light beams LB5a and LB5b obtained by the birefringent prism 204; 206a, a track on the target object 206; and 207, a photodetector.

In this arrangement, the modes of polarized light can be selectively controlled by controlling the amount of a current injected into the electrodes 201a and 201b. The structure and oscillation principle of the laser apparatus will be apparent from the detailed description of the previous embodiments.

A light beam generated by the semiconductor laser apparatus 201 and the lens 202 is incident on the birefringent prism 204 to be refracted. If a birefringent material such as quartz, calcite, or titanium oxide is used for the prism 204, since the refractive index of the light beam differs depending on its polarizing direction, the angle of refraction of the light beam differs. In this case, in the TE mode, the vibrating direction of an electric field, i.e., the polarizing direction, is parallel to the drawing surface of FIG. 12. In the TM mode, the polarizing direction is perpendicular to the drawing surface of FIG. 12. If the crystal orientation of a prism material is determined in a manufacturing process such that the refractive index of the prism 204 is higher in the TE mode than in the TM mode, light beams LB5a and LB5b can be extracted in the TM and TE modes, respectively.

FIG. 13 shows an enlarged state of the light beams LB5a and LB5b and the track 206a. By only performing current injection control with respect to the electrodes of the laser apparatus, polarization control in the TE and TM modes can be performed. As a result, light beams can be scanned over the track 206a so as to sandwich the track 206a. When light reflected by the target object 206 reaches the beam splitter 203 through the birefringent prism 204, the optical path of the light is split by the beam splitter 203, and the light is converted into an electrical signal by the photodetector 207. The photodetector 207 detects changes in the refractive index of the light beams LB5a and LB5b of the TE and TM modes, reflected by the track 206a. If the target object 206 or the overall optical sensor is moved by a positioning mechanism (not shown) such that these refractive index changes become equal to each other, the relative positions of the track and the optical sensor can be kept constant. In this embodiment, since a polarizing mirror mechanism such as a galvanomirror is not required, a compact, simple arrangement can be realized. In addition, polarization control in the laser apparatus can be performed by only controlling current injection. Therefore, scanning of light beams can be performed at very high speed as compared with a case wherein an optical path is deflected by a mechanism.

Figure 14:
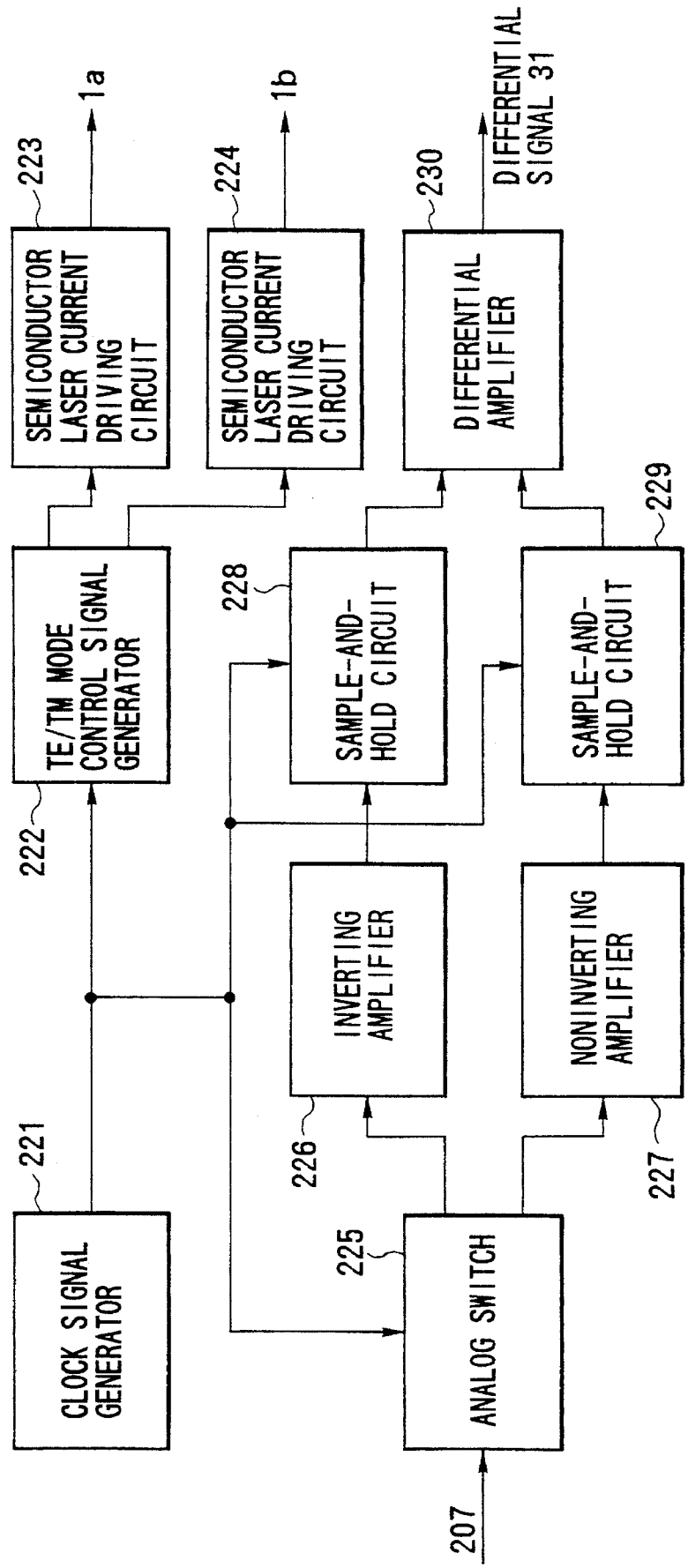
FIG. 14 is a block diagram showing a detailed arrangement of a signal processing circuit used for the optical sensor in FIG. 12.
Figure 15:
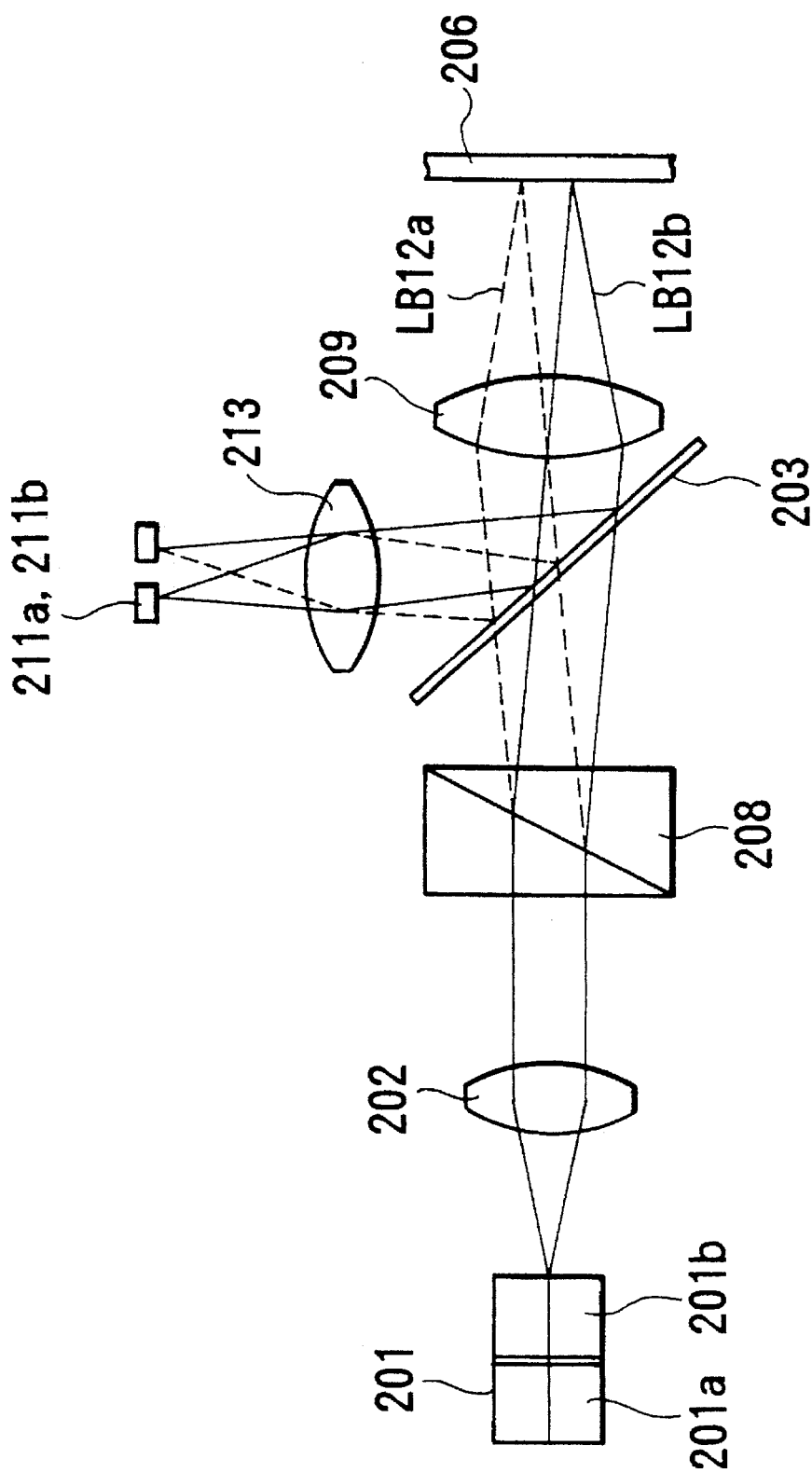
FIG. 15 is a system diagram showing another embodiment in which the semiconductor laser apparatus of the present invention is applied to an optical sensor.

FIG. 14 shows an embodiment of the present invention, specifically a signal processing circuit in the embodiment shown in FIG. 12. Referring to FIG. 14, reference numeral 221 denotes a clock signal generator; 222, a TE/TM mode laser oscillation control signal generator; 223 and 224, current driving circuits for the semiconductor laser apparatus; 225, an analog switch; 226, an inverting amplifier; 227, a noninverting amplifier; 228 and 229, sample-and-hold circuits; and 230, a differential amplifier. In the embodiment shown in FIG. 14, light beams LB12a and LB12b of the TE and TM modes are reflected by a target object 10 and are separated by different photodetectors 211a and 211b so as to be converted into electrical signals. This embodiment, however, requires a lens 213, and the positions of the photodetectors and focused reflected light beams must be adjusted. For this reason, the embodiment is disadvantageous in terms of a reduction in size and cost. The signal processing circuit shown in FIG. 15 is a circuit having a simple optical arrangement such as the one shown in FIG. 12 and designed to separate light beams of the TE and TM modes reflected by a target object and converting them into electrical signals by using one photodetector in a time sharing manner. The timing of switching between the TE and TM modes is controlled by a clock pulse from the clock signal generator 221 in synchronism with the laser oscillation control signal generator 222, the current driving circuits 223 and 224 for the semiconductor laser apparatus, the analog switch 225, and the sample-and-hold circuits 228 and 229. The laser oscillation control signal generator 222 injects a required current into electrodes 201a and 201b of the semiconductor laser apparatus through the current driving circuits 223 and 224 to alternately switch the oscillation mode of the semiconductor laser apparatus (not shown) between the TE and TM modes. At the same time, an electrical signal representing a reflectance change with respect to the target object, supplied from the photodetector 207 (not shown), is selectively distributed to either the inverting amplifier 226 or the noninverting amplifier 227 by the analog switch 225 in synchronism with a clock. While intermittent signals are integrated by the sample-and-hold circuits 228 and 229, a differential signal 231 based on the difference between outputs from the sample-and-hold circuits 228 and 229 is obtained by the differential amplifier 230. The differential signal 231 obtained in this manner is a signal equivalent to a differential signal based on the difference between electrical signals from photodetectors 211a and 211b in FIG. 14. By using the electrical circuit shown in FIG. 15, a differential signal based on detection signal obtained by detecting light beams of the TE and TM modes can be detected by using one photodetector.

FIG. 15 shows still another embodiment in which the semiconductor laser apparatus of the present invention is applied to an optical sensor. The same reference numerals in FIG. 15 denote the same parts as in FIG. 12.

Referring to FIG. 14, reference numerals 209 and 213 denote lenses; 203, a beam splitter; 208, a Wollaston prism formed by bonding birefringent prisms to each other; and 211a and 211b, photodetectors. Reference symbols LB12a and LB12b denote light beams.

Referring to FIG. 14, a light beam is generated by a semiconductor laser apparatus 201 which is formed as one unit and capable of performing polarization control in the TE and TM modes according to the present invention shown in FIGS. 1 to 4, and a lens 202. The light beam is then incident on the Wollaston prism 208 to be refracted. In this case, the Wollaston prism 208 can extract the light LB12a in the TM mode, and the light beam LB12b in the TE mode. The respective light beams are focused on a target object 206 through the lens 209. Since the principle of measurement of a track position of the object is the same as that in the above embodiments, a description thereof will be omitted. Note, however, that since the beam splitter 203 for splitting the optical path of each reflected light beam is arranged at the rear side of each optical path of the Wollaston prism 208, the optical paths of the reflected light beams LB12a and LB12b, extending to the photodetectors 211a and 211b, are separated from each other. Therefore, the light beams LB12a and LB12b can be easily separated from each other spatially by the lens 213.

Figure 16:
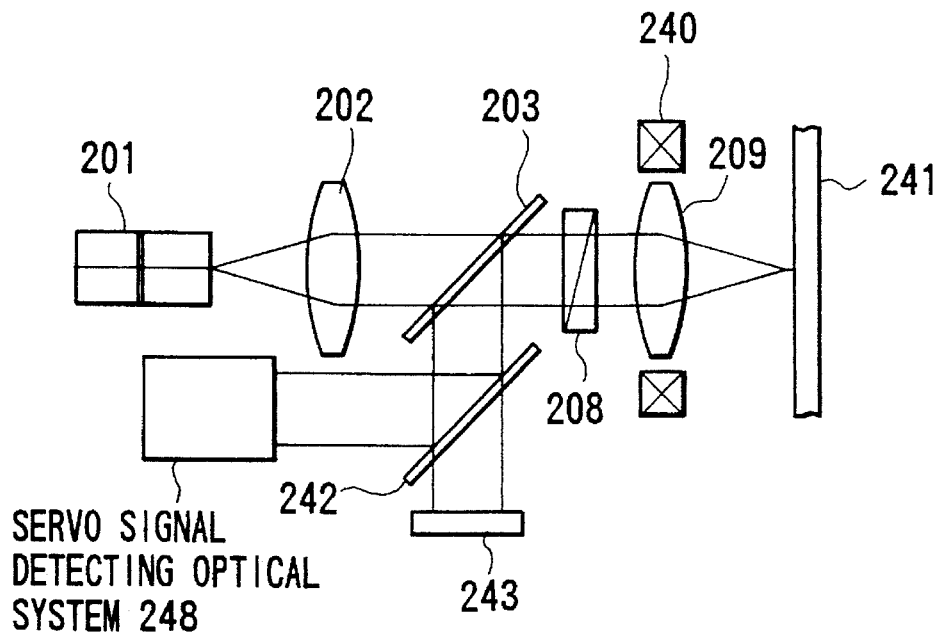
FIG. 16 is a system diagram showing an embodiment in which the semiconductor laser apparatus of the present invention is applied to an optical disk head.
Figure 17:
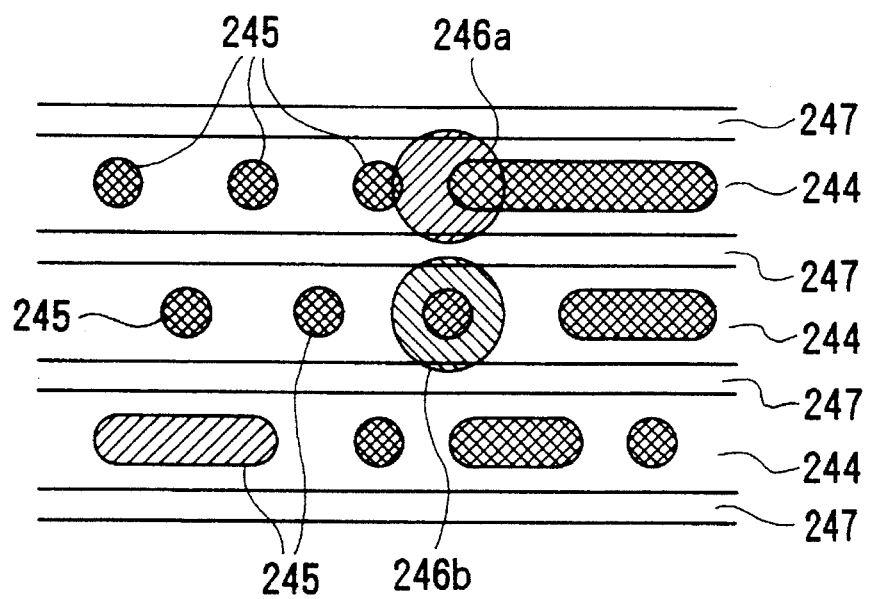
FIG. 17 is a view for explaining an operation of the embodiment in FIG. 16.

FIG. 16 shows an embodiment in which the present invention is applied to an optical head. FIG. 17 shows an enlarged state of an optical disk and light beams. The same reference numerals in FIGS. 16 and 17 denote the same parts as in FIG. 14.

Referring to FIGS. 16 and 17, reference numeral 240 denotes an actuator for positioning a lens 209; 241, an optical disk; 242, a beam splitter; 243, a photodetector; 244, a track on the optical disk 241; 247, a guide groove in the optical disk 241; 245, a data mark recorded on the optical disk 241; 246a and 246b, beam spots of the TE and TM modes; and 248, a servo signal detecting optical system. When the polarization mode of the semiconductor laser apparatus is switched between the TE and TM modes, light beam is polarized by a Wollaston prism 208 according to the polarization mode so that the beam spots 246a and 246b radiate the data marks 245 while alternately moving over the adjacent tracks 244 on the optical disk 241. The light beams reflected by the optical disk 241 are split by the beam splitters 203 and 208 and are converted into electrical signals by the photodetector 243. In this case, the optical disk 241 is rotated, and its linear speed is 5 m/s to 15 m/s if it has a diameter of 130 mm. Since switching of current injection to the laser apparatus to switch between the TE and TM modes is performed at a speed of 1 ns or less, parallel signals can be read almost at the same time. As described above, the beam spots 246a and 246b are alternately radiated on two tracks while the polarization mode of the semiconductor laser apparatus 201 is switched between the TE and TM modes, thereby realizing a parallel data reading operation.

Figure 18:
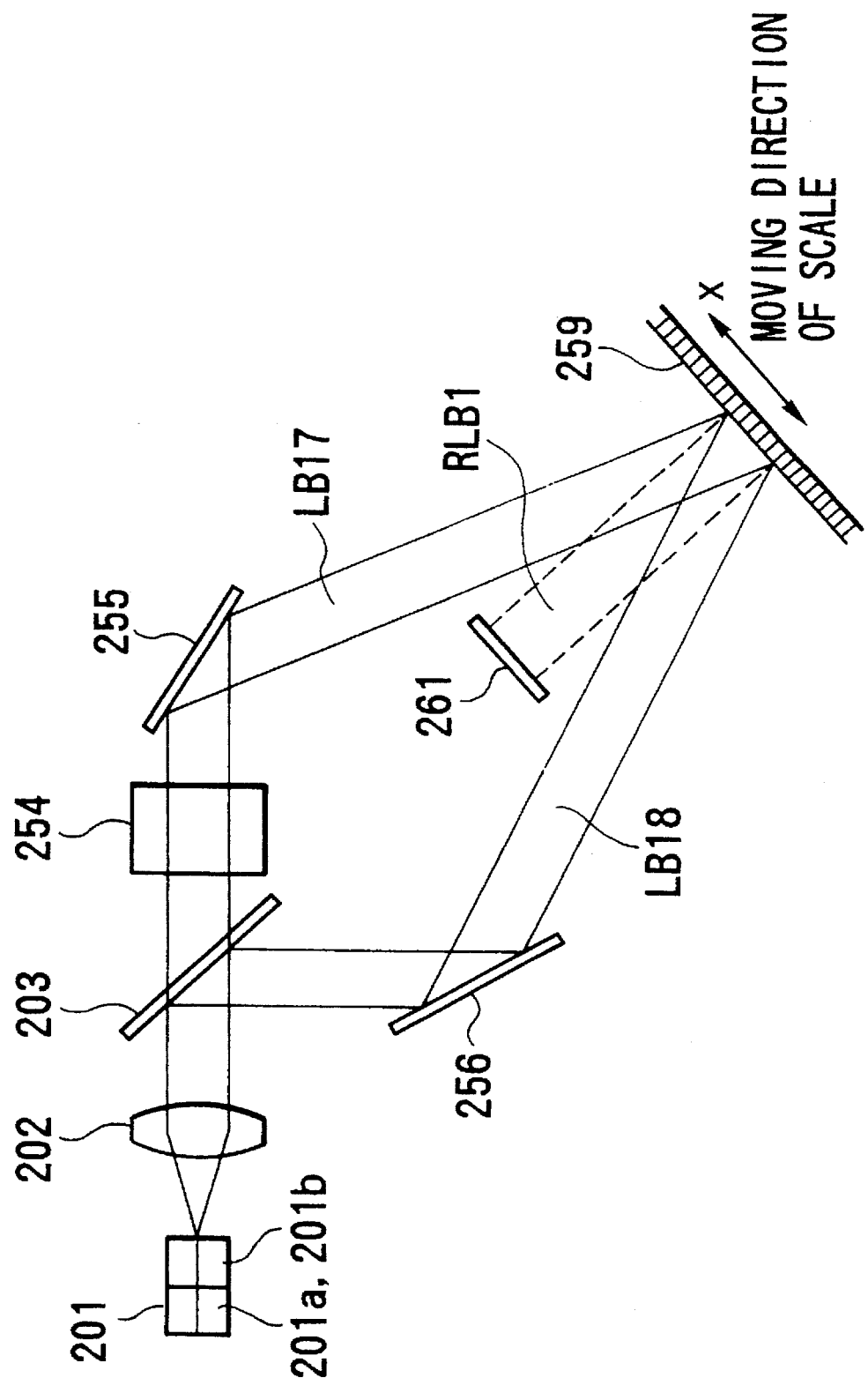
FIG. 18 is a system diagram showing an embodiment in which the semiconductor laser apparatus of the present invention is applied to an optical encoder.

FIG. 18 shows an embodiment in which the semiconductor laser apparatus according to the present invention is applied to an optical encoder.

Referring to FIG. 18, reference numeral 201 denotes a semiconductor laser apparatus constituted by the single element shown in FIG. 1 and capable of performing oscillation control in the TE and TM modes; 202, a lens; and 203, a beam splitter. These components have the same arrangements as those in FIG. 12. Reference numeral 254 denotes a birefringent plate arranged after the beam splitter 203; 259, a diffraction grating scale; 261, a photodetector; and 255 and 256, mirrors respectively arranged between the birefringent plate 254 and the diffraction grating scale 259 and between the beam splitter 203 and the diffraction grating scale 259. Reference symbols LB17 and LB18 denote light beams; and RLB1, a diffracted light beam.

A light beam generated by the semiconductor laser 201 and the lens 202 is divided into two light beams by the beam splitter 203. One light beam LB17 is transmitted through the birefringent plate 254 and is reflected by the mirror 255, and the other light beam LB18 is directly reflected by the mirror 256 so that the two light beams LB17 and LB18 cross each other on the diffraction grating scale 259 as an object to be measured. The diffracted light beam RLB1 deriving from the two light beams LB17 and LB18 is detected as a coherent light intensity by the photodetector 261.

In this arrangement, as the diffraction grating scale 259 linearly moves, the light intensity signal obtained by the photodetector 261 is modulated in the form of a sine wave. This light intensity signal is modulated by an amount corresponding to two periods every time the scale 259 is moved by one pitch. In this case, the birefringent plate 254 is a plane-parallel plate consisting of a birefringent material such as quartz, calcite, or titanium oxide. Since the reflectance differs depending on the polarizing direction of a light beam, the optical path length between the beam splitter 203 and the mirror 255 can be electrically changed by switching the polarization mode of the semiconductor laser 201 between the TE and TM modes. More specifically, if the wavelength of a laser beam is represented by $\lambda$; the refractive index difference based on the polarization of the birefringent plate 254, $\delta n$; and the thickness of the birefringent plate 254, T, then an optical path length difference $\delta\phi$ is given by $T/(\lambda \cdot \delta n)$. Assume that the constant of the birefringent plate 254 is set to establish $\delta\phi=\frac{1}{4}$.. In this case, when the polarization mode of the semiconductor laser 201 is switched between the TE and TM modes, the coherent light intensity signal based on the diffracted light beam RLB1 in the TE mode and that based on the diffracted beam RLB1 in the TM mode shift in phase from each other by a ¼ period. Therefore, a detection output indicating a scale position can be obtained by the photodetector 261, while the detection output is modulated with the phase difference $\delta\phi$ set on the basis of the optical path length difference at the birefringent plate 254, by switching the oscillation mode of the semiconductor laser 201 between the TE and TM modes at a period sufficiently shorter than the period at which an optical output from the photodetector 261 is modulated by the movement of the diffraction grating scale 259. This operation will be described below with reference to FIGS. 19 to 20D.

Figure 19:
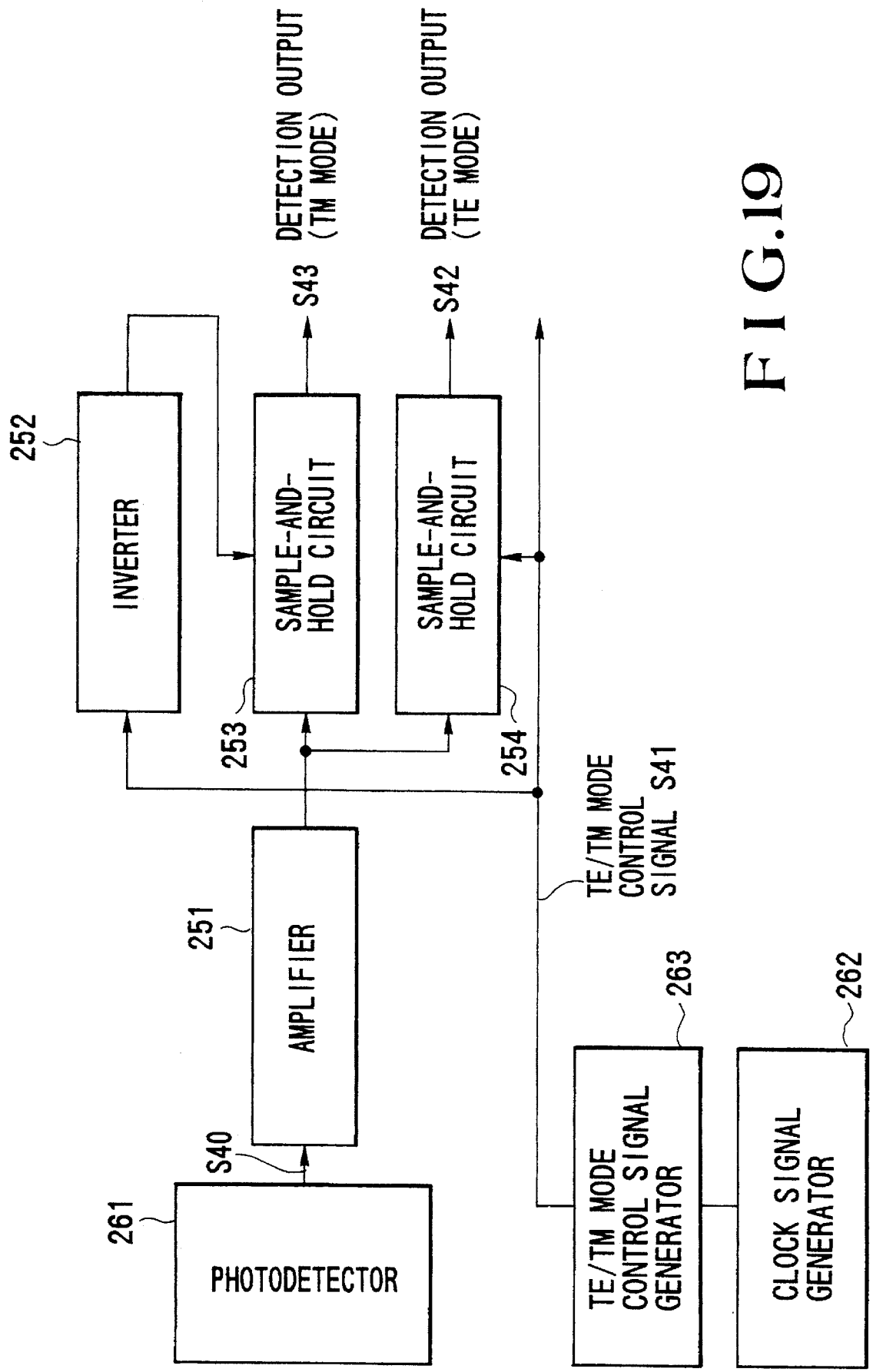
FIG. 19 is a view showing a detailed arrangement of a signal processing circuit applied to the optical encoder in FIG. 18.

FIG. 19 shows a detailed arrangement of a system for processing a signal detected by the photodetector 261. Referring to FIG. 19, reference symbol S40 denotes an output from the photodetector 261; S41, a TE/TM mode control signal; S42, a TE mode detection signal; and S43, a TM mode detection signal. Reference numeral 251 denotes an amplifier for amplifying the signal S40 output from the photodetector 261; 252, an inverter for inverting the supplied TE/TM mode control signal S41; and 253 and 254, sample-and-hold circuits for sampling/holding the output from the amplifier 251 on the basis of the output from the inverter 252 and the TE/TM mode control signal. Note that reference numeral 263 denotes a TE/TM mode control signal generator for generating the TE/TM mode control signal S41 upon reception of a clock signal from a clock signal generator 262.

Figures 20A, 20B, 20C, 20D:
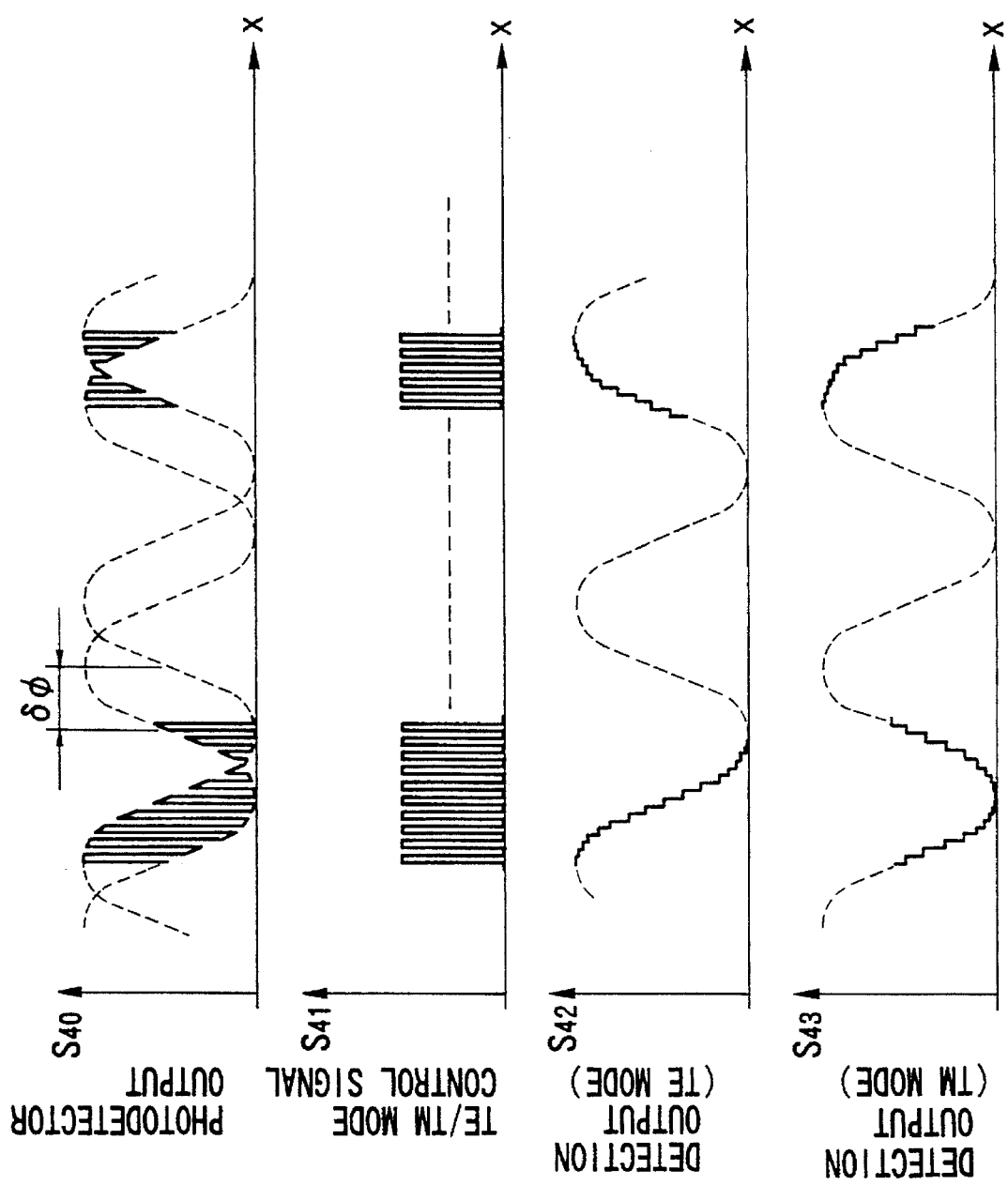
FIGS. 20A to 20D are timing charts for explaining an operation of the circuit in FIG. 19.

An operation of the system shown in FIG. 19 will be described with reference to the timing charts in FIGS. 20A to 20D. When the polarization mode of the semiconductor laser 201 is switched between the TE and TM modes, the detection signal S40 shown in FIG. 20A is intensity-modulated in the form of a sine wave in accordance with a scale moving amount x while it is modulated with the optical path length difference $\delta\phi$ based on the polarization. In this case, $\delta\phi=\frac{1}{4}$. is set, and an output from the amplifier 251, obtained by amplifying the detection signal S40, is input to the two sample-and-hold circuits 253 and 254 in accordance with the TE/TM control signal S41 shown in FIG. 20B. The sampling/holding synchronization polarities of the two sample-and-hold circuits 253 and 254 are switched to output signals. As a result, the TE mode detection output S42 shown in FIG. 20C and the TM mode detection output S43 shown in FIG. 20D can be separately output. These signals are 90° out of phase. By comparing the magnitudes of the two signals with each other, not only the distance the scale moves but also its moving direction can be discriminated.

Figure 21:
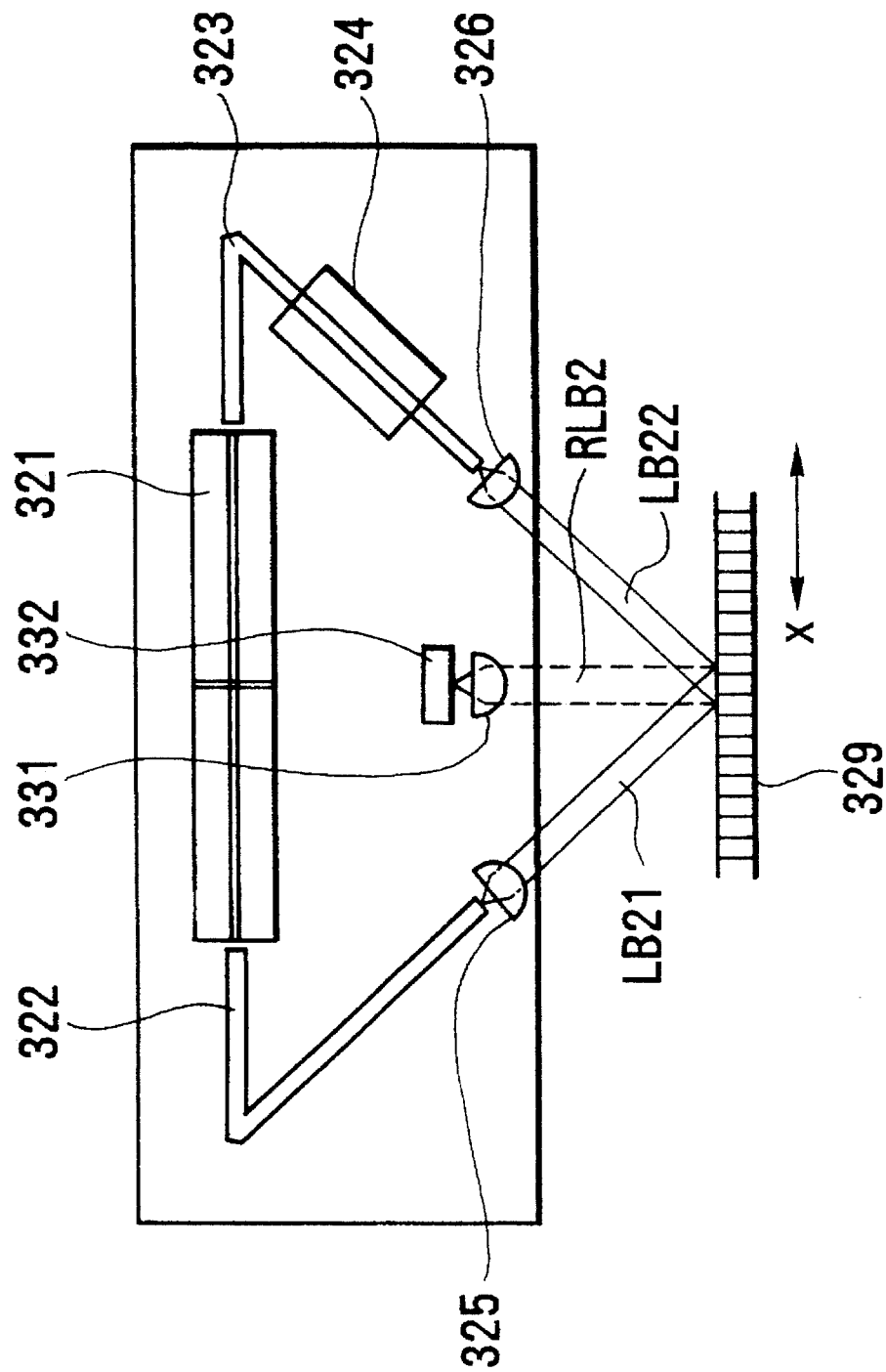
FIG. 21 is a system diagram showing another embodiment in which the semiconductor laser apparatus of the present invention is applied to an optical encoder.

FIG. 21 shows another embodiment in which the present invention is applied to an optical encoder using an optical waveguide, specifically an optical system for performing interference detection while changing the optical path length by polarization control. Referring to FIG. 21, reference numeral 321 denotes a semiconductor laser apparatus capable of performing oscillation control in the TE and TM modes according to the present invention; 322 and 323, waveguides; 324, a birefringent waveguide; 325 and 326, lenses; 329, a diffraction grating scale; 331, a lens; and 332, a photodetector. Reference symbols LB21 and LB22 denote light beams; and RLB2, a diffracted light beam.

In the embodiment shown in FIG. 21, the bent waveguides 322 and 323, each having a refractive index optical guide layer consisting of, e.g., quartz, PMMA, or polyimide, are formed at the two ends of the TE/TM control semiconductor laser 321, and the waveguide 324 having birefringence is inserted in part of the waveguide 323. In this case, birefringence can be provided by applying a strain to a material having a photoelastic effect, e.g., polyimide or polycarbonate, or by using an optical anisotropic material, e.g., quartz or titanium oxide. The lenses 325 and 326, each formed by mixing/stacking silicon oxide or silicon nitride to have a refractive index distribution in the vertical direction and an aspherical shape in the horizontal direction, are respectively arranged at two ends of the waveguides 322 and 323 so that the light beams LB21 and LB22 emitted from the waveguides 322 and 323 are collimated and radiated on the diffraction grating scale 329 while the two light beams cross each other. The diffracted light beam RLB2 from the diffraction grating scale 329 is focused on the photodetector 332 through the lens 331, formed by the same method as that for the lenses 325 and 326, and the coherence light intensity of the diffracted light beam RLB2 is detected. As in the description of the operation of embodiment in FIG. 18, the refractive index of the birefringent waveguide 324 differs depending on polarization of the TE/TM mode for oscillation of the semiconductor laser 321. However, by setting the optical path length difference to be ¼ the wavelength, the phase difference between detection signals obtained by the photodetector 332 during movement of the scale can be modulated by 90°. In signal detection, similar to the description of the embodiments in FIGS. 19 to 20D, while the oscillation mode of the semiconductor laser 321 is switched between the TE and TM modes at high speed, a detection output from the photodetector 332 is sampled/held by two sample-and-hold circuits (not shown) in synchronism with switching between the TE and TM modes, thereby separately extracting a detection output of the TE mode and a detection output of the TM mode. By using the detection signals which are 90° out of phase, obtained in this manner when the scale is moved, the moving amount and direction of the scale can be measured.

FIGS. 22 and 23 show an embodiment in which the semiconductor laser apparatus according to the present invention is applied to a display apparatus. FIGS. 25A to 25D show waveforms of currents to explain an operation of the display apparatus.

Referring to FIGS. 22 and 23, reference numeral 201 denotes a semiconductor laser apparatus which is formed as a unit and capable of performing TE/TM mode control; and 202, a lens. These components are identical to those shown in FIGS. 1 to 12, as in the above description. Reference numerals 373 and 374 denote galvanomirrors; 375, a lens; and 376, a screen. Reference symbol LB27 denotes a light beam. Reference numerals 378 and 379 denote patterns irradiated with light; and 380, polarizing spectacles. Referring to FIGS. 25A to 25D, reference symbols S51 and S52 denote galvanomirror driving currents; and S53 and S54, laser driving currents.

The light beam LB27 generated by the semiconductor laser apparatus 201 and the lens 202 is polarized by the galvanomirrors 373 and 374 in directions θx and θy and is focused by the lens 375. The light beam LB27 is then scanned on the screen 376 in x and y directions. Upon modulation of the light intensity and polarization of the semiconductor laser apparatus 201 in synchronism with the deflecting/scanning operation of this light beam, an image or the like is displayed on the screen 376. In a stereoscopic display operation, as shown in FIG. 23, the patterns 378 and 379 scanned/irradiated with light beams having different polarization states are observed by an observer (not shown) wearing the polarizing spectacles 380. The observer then can recognize a stereoscopic effect because of the parallax. On the screen 376, the two patterns corresponding to the parallax, the patterns of the character "A" in this case, are displayed by light beams having different polarization states so as to be shifted from each other by δL. In order to realize this, as shown in FIGS. 25A to 25D, the driving current S51 for the galvanomirror 374, supplied in the form of a sawtooth wave, scans the light beam LB27 in the x direction, and the driving current S52 for the galvanomirror 373, supplied in the form of a stepped wave, scans the light beam LB27 in the y direction, while the driving current S54 for causing laser emission in the TM mode is supplied to the semiconductor laser apparatus 201 with a delay δT with respect to the driving current S53 for causing laser emission in the TE mode. In this case, if the width by which the light beam LB27 is scanned on the screen 376 in the x direction is represented by L, and the sawtooth wave period of the driving current S51 for the galvanomirror 373 is represented by T, a desired parallax can be obtained by setting δT=δL× T÷L.

As described above, by performing emission control of the semiconductor laser apparatus in the TE and TM modes in accordance with a parallax while scanning a light beam two-dimensionally with the galvanomirrors, a three-dimensional display can be realized with a simple, compact optical system.

Figures 24A, 24B, 24C, 24D:
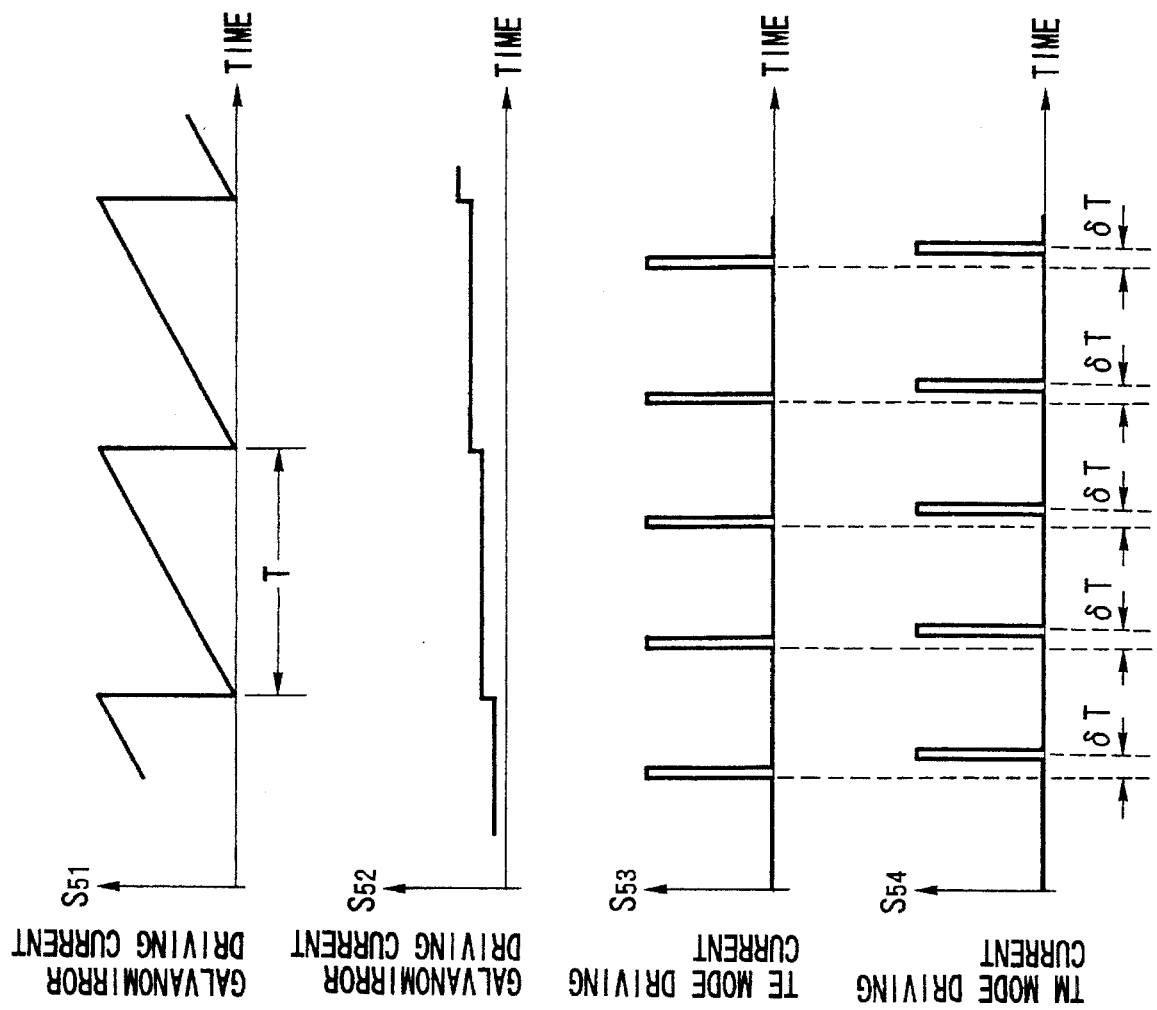
FIG. 24 is a block diagram showing a detailed arrangement of a driving control circuit in FIG. 22.
Figure 26:
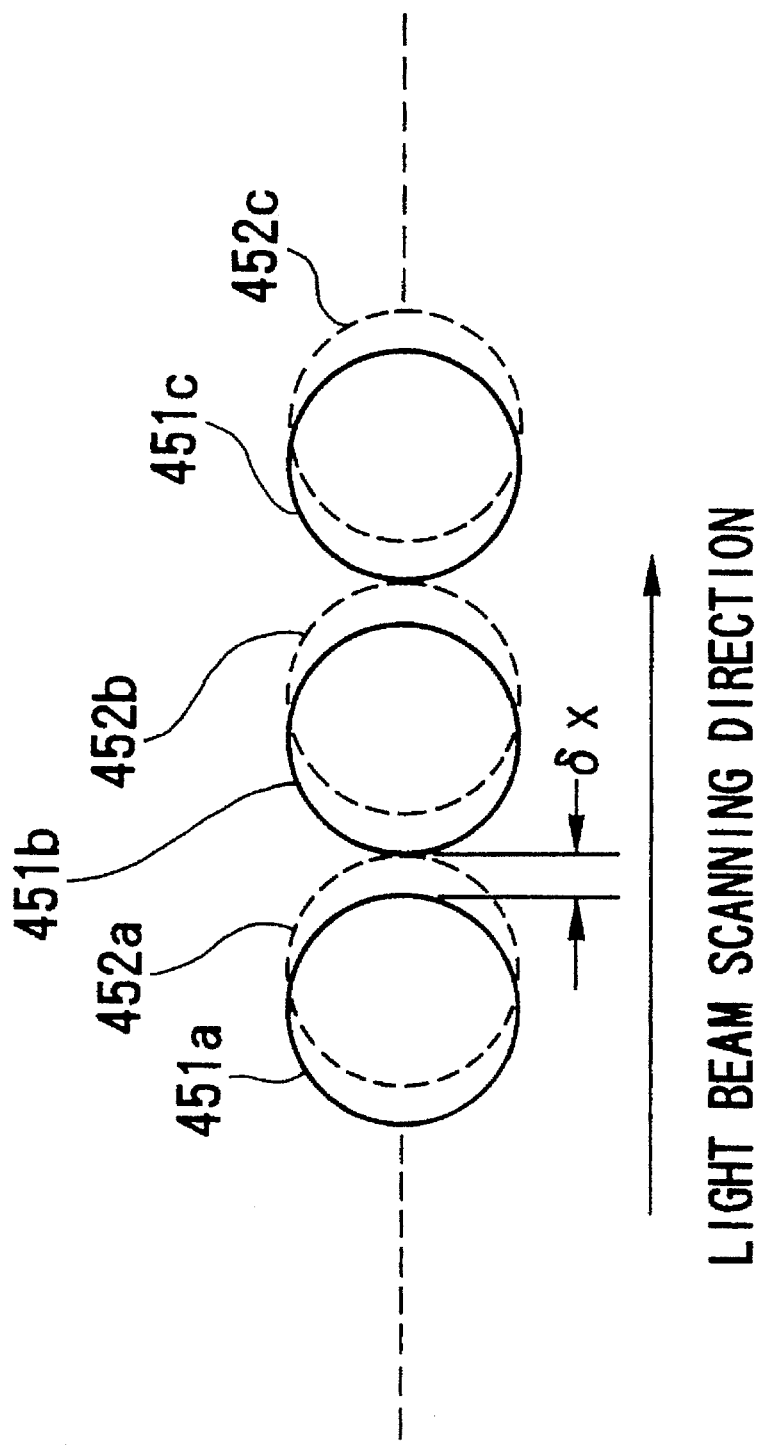
FIG. 26 is a view showing the relationship between a driving operation and the radiation position of a light beam in order to explain the operation of the circuit in FIG. 24.

FIG. 24 is a view for explaining polarization mode control of a light beam, shown in FIG. 22, and a deflection control circuit for the galvanomirrors. FIG. 26 is a view for explaining a scanning operation of a light beam.

Referring to FIGS. 24 and 26, reference numeral 431 denotes a computer; 432, a clock generator; 433 and 434, frame memories; 435 and 436, pulse generators; 437, a delay circuit; 348, a TE mode laser driving circuit; 439, a TM mode laser driving circuit; 440, a sync signal converter; 441, a horizontal scanning circuit; 442, a vertical scanning circuit; 443 and 444, galvanomirror driving circuits; 451a, 451b, and 451c, TE mode beam spots; and 452a, 452b, and 452c, TM mode beam spots.

Emission control of the semiconductor laser apparatus in the TE and TM modes in accordance with a parallax while scanning a light beam two-dimensionally with the galvanomirrors is performed by using the control circuit shown in FIG. 24 in the following manner. Three-dimensional display image data based on a parallax and created by the computer 431 are respectively stored in the two frame memories 433 and 434 in synchronism with a sync signal from the clock generator 432, and are output to the pulse generators 435 and 436 for driving the semiconductor laser apparatus 201, thereby causing the semiconductor laser apparatus 201 to emit light in the form of a pulse while switching between the polarization modes by using the laser driving circuits 438 and 439. In this case, the sync signal from the clock generator 432 is input to the horizontal scanning circuit 441 to cause a galvanomirror (not shown), through the galvanomirror driving circuit 443, to perform a scanning operation in the form of a sawtooth wave in a horizontal direction (θx direction in FIG. 22). The sync signal is also input to the vertical scanning circuit 442 to cause a galvanomirror (not shown), through the galvanomirror driving circuit 444, to perform a scanning operation in the form of a stepped wave in a horizontal direction (θy direction in FIG. 22). These scanning operations of the galvanomirrors correspond to horizontal and vertical scanning of a TV signal, and hence writing and reading operations with respect to the frame memories 433 and 434 by horizontal and vertical scanning are completely synchronized. The delay circuit 437 is a circuit for slightly delaying laser oscillation in the TM mode relative to laser oscillation in the TE mode when it is required to radiate light beams polarized in the TE and TM modes at the same position on the screen. As shown in FIG. 26, radiation of light beams of the two polarization modes can be performed at substantially the same position by performing radiation of the beam spot 451a of the TE mode and radiation of the beam spot 452a of the TM mode with a short delay time set therebetween by performing short-time pulse oscillation. In addition, light beams are not continuously emitted/radiated but are intermittently emitted/radiated in the scanning directions of the light beams, as the beam spots 451a, 451b, and 451c in FIG. 26. If, however, the scanning speed is set such that the beam spots are seen to be continuous owing to an after image effect, or a screen having an after image effect is used, no problems are posed.

Figure 27:
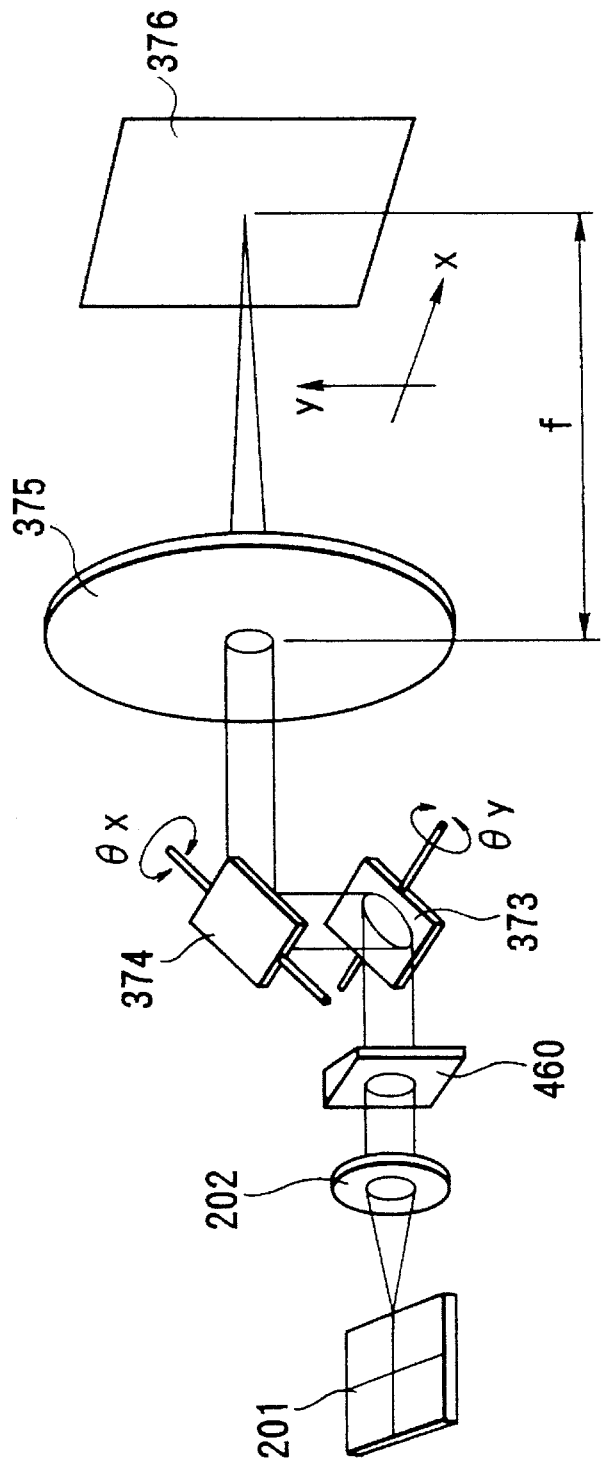
FIG. 27 is a system diagram showing another embodiment in which the semiconductor laser apparatus of the present invention is applied to a display unit.
Figure 28:
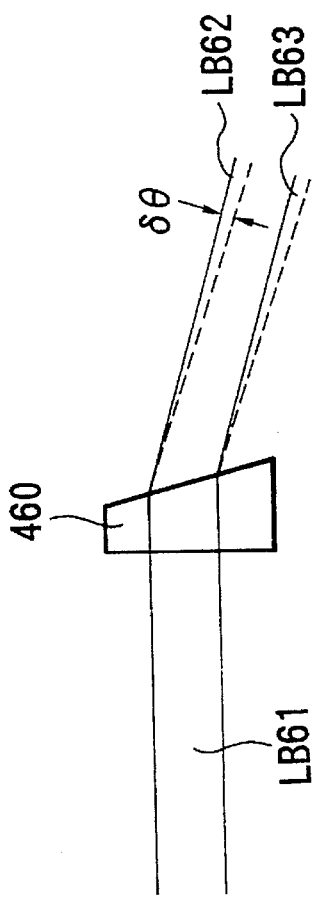
FIG. 28 is a view for explaining shift correction in FIG. 27.

FIG. 27 shows another embodiment in which the semiconductor laser apparatus according to the present invention is applied to a display apparatus. This embodiment discloses the optical arrangement of a display apparatus having an optical element for correcting the difference between the radiation position of the beam spot 451a of the TE mode and that of the beam spot 452a of the TM mode shown in FIG. 26. FIG. 28 is a view for explaining an operation of the optical element for correcting the difference. Reference numeral 460 denotes a birefringent prism 460. Reference symbol LB61 denotes a light beam incident on the birefringent prism 460; and LB62 and LB63, light beams refracted by the birefringent prism 460.

As described with reference to FIG. 26, even in a case wherein TE and TM mode polarized light beams need to be radiated at the same position on the screen 376, since the two modes cannot be oscillated at the same time, laser oscillation in the TM mode is produced slightly after laser oscillation in the TE mode. As a result, in the display apparatus shown in FIG. 22, the beam spot 451a of the TE mode and the beam spot 452a of the TM mode differ in position from each other. For this reason, as shown in FIG. 27, the birefringent prism 460 is arranged in the optical path between lenses 202 and 375 to return the beam spot 452a of the TM mode to the position of the beam spot 451a of the TE mode by means of refraction through the prism 460 upon polarization of the TE and TM modes, thereby correcting the difference in position. That is, in FIG. 28, the difference can be corrected by setting a difference $\delta\phi$ in angle of refraction between the light beam LB63 refracted in the TM mode and the light beam LB62 refracted in the TE mode to satisfy $\delta X = f \times \tan(\delta\phi)$ where $\delta X$ is the difference in position between the light beams 451a and 452a in FIG. 26, and f is the focal length of the lens 375 in FIG. 27.

With this arrangement, by performing emission control of the semiconductor laser apparatus in the TE and TM modes in accordance with a parallax while scanning a light beam two-dimensionally with the galvanomirrors, three-dimensional display can be realized by using a simple, compact optical system instead of an optical arrangement of two display elements or light beams positioned with high precision as in a conventional display apparatus.

What is claimed is:

1. A semiconductor laser apparatus comprising:

a semiconductor substrate having a first electrode on one surface;

a first cladding layer formed on the other surface of said semiconductor substrate;

an active layer placed on said cladding layer;

a second cladding layer placed on said active layer;

a second electrode placed on said second cladding layer; and a pair of resonator mirrors placed in a wave guide direction perpendicular to the surfaces of said semiconductor substrate to oppose each other and constituting opposing side surfaces of said wave guide, wherein said active layer is constituted by a quantum well layer having a tensilely strain, and said second electrode is separated into portions not less than two portions in a propagating direction of light in said wave guide.

2. An apparatus according to claim 1, wherein a strain is applied to said active layer such that a gain of a TM mode is not less than that of a TE mode.

3. An apparatus according to claim 1, wherein said second cladding layer has a protruding portion constituting a refractive index waveguide at a portion corresponding to one of said divided electrodes and extending in a direction to cross the surface of said semiconductor substrate.

4. An apparatus according to claim 3, wherein a portion, of said second cladding layer, corresponding to the other electrode of said divided electrodes is made flat so as not to form a refractive index waveguide.

5. An apparatus according to claim 1 further comprising:

a slanted resonator mirror placed between the opposing side surfaces of said wave guide at a Brewster angle of a TE mode.

* * * * *

UNITED STATES PATENT AND TRADEMARK OFFICE
CERTIFICATE OF CORRECTION

PATENT NO. : 5, 497, 390
DATED : March 5, 1996
INVENTOR(S) : Tanaka et al.

Figure 3C:
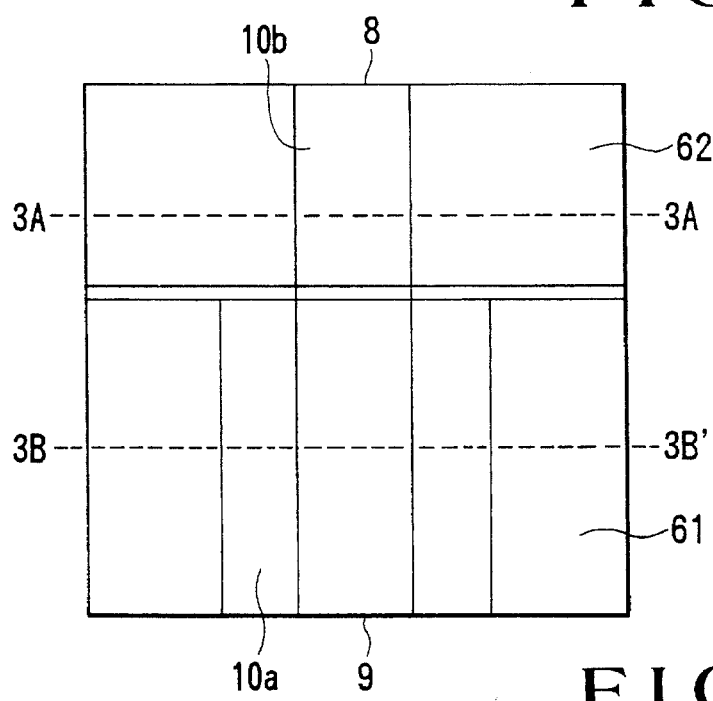

It is certified that errors appear in the above-identified patent and that said Letters Patent is hereby corrected as shown below:

In Fig.3C on the right side, please delete " 3A " and insert -- 3A' --.

In Fig.24A - 24D, please delete the number " 24" and insert -- 25 --.

In Fig.25, please delete the number " 25 " and insert -- 24 --.

In column 8 at line 64, please delete " $t_n \neq$ " and insert -- $t_{n+3}$ --.

Signed and Sealed this

Seventeenth Day of September, 1996

Attest:

BRUCE LEHMAN

Attesting Officer      Commissioner of Patents and Trademarks